United States Patent [19]
Yoshizawa et al.

[11] Patent Number: 5,058,800
[45] Date of Patent: Oct. 22, 1991

[54] METHOD OF MAKING ELECTRIC CIRCUIT DEVICE

[75] Inventors: Tetsuo Yoshizawa; Hiroshi Kondo, both of Yokohama; Takashi Sakaki; Masaaki Imaizumi, both of Tokyo; Hideyuki Nishida, Kawasaki; Yasuteru Ichida, Tokyo; Masaki Konishi, Ebina, all of Japan

[73] Assignee: Canon Kabushiki Kaisha, Tokyo, Japan

[21] Appl. No.: 358,639

[22] Filed: May 30, 1989

[30] Foreign Application Priority Data

May 30, 1988 [JP] Japan .................. 63-133131
May 30, 1988 [JP] Japan .................. 63-133132
May 30, 1988 [JP] Japan .................. 63-133133

[51] Int. Cl.$^5$ ............................. H01L 21/58
[52] U.S. Cl. .................. 228/180.2; 228/110; 219/85.11
[58] Field of Search ........ 228/180.2, 175, 110; 219/85.11, 85.14, 85.15, 85.13, 9.5; 29/841, 860

[56] References Cited

U.S. PATENT DOCUMENTS

| | | | |
|---|---|---|---|
| 2,803,731 | 8/1957 | Coburn | 219/9.5 |
| 3,617,682 | 11/1971 | Hall | 219/85 |
| 4,079,511 | 3/1978 | Grabbe | 29/841 X |
| 4,347,661 | 9/1982 | Golla | 219/9.5 X |
| 4,582,975 | 4/1986 | Daughton | 219/85.15 |
| 4,664,309 | 5/1987 | Allen et al. | 228/180.2 |
| 4,789,767 | 12/1988 | Doljack | 219/85.11 |
| 4,840,924 | 6/1989 | Kinbara | 437/189 |

FOREIGN PATENT DOCUMENTS

| | | |
|---|---|---|
| 1514656 | 2/1968 | France .................. 219/85.13 |
| 42-002096 | 1/1967 | Japan . |
| 59-139636 | 8/1984 | Japan . |
| 60-057944 | 4/1985 | Japan . |
| 2057195 | 3/1981 | United Kingdom . |

*Primary Examiner*—Kenneth J. Ramsey
*Attorney, Agent, or Firm*—Fitzpatrick, Cella, Harper & Scinto

[57] ABSTRACT

A method of making an electric circuit device by connecting first and second electrical circuit components through an electrical connecting member. The method comprises effecting internal heating such as supersonic heating, high-frequency induction heating, high-frequency dielectric heating or microwave heating at first connecting regions between the connecting portions of the first electrical circuit component and the first ends of the electrically conductive members of the electrical connecting member. The same internal heating may also be effected at second connecting regions between the connecting portions of the second electrical circuit component and the second ends of the electrically conductive members of the electrical connecting member. In consequence, alloying takes place in first and second connecting regions so as to connect the first and second electrical circuit components through the electrical connecting member.

21 Claims, 31 Drawing Sheets

METHOD OF MAKING ELECTRIC CIRCUIT DEVICE

BACKGROUND OF THE INVENTION

1. Field of the Invention

The present invention relates to a method of making an electric circuit device which is formed by connecting electric circuit components through an electrical bonding member.

2. Related Background Art

The following methods are known as methods for electrically connecting electrical circuit components:

(1) Wire Bonding Method (2) TAB (Tape Automated Bonding) Method (as disclosed in, for example, Japanese Patent Unexamined Publication No. 59-139636)

(3) CCB (Controlled Collapse Bonding) Method (as disclosed, for example, in Japanese Patent Examined Publication No. 42-2096 and Japanese Patent Unexamined Publication No. 60-57944)

(4) The method as shown in FIGS. 1 and 2

(5) The method as shown in FIG. 3

(6) Method as Shown in FIG. 4

The method (4) as shown in FIGS. 1 and 2 will be described.

An insulating film 71 made of polyimide or the like material is formed on a portion of a first semiconductor device 4 other than a connecting portion 5, while a metallic member 70 such as Au is provided on the connecting portion 5. Subsequently, the semiconductor has exposed surfaces 73, 72 of the metallic member 70 and the insulating film 71. On the other hand, an insulating film 71' of polyimide or the like material is formed on the portion of a second semiconductor device 4' other than the connecting portion 5'. At the same time, a metallic member 70' such as Au is provided on the connecting portion 5'. Then, after smoothing the exposed surfaces 73' and 72' of the metallic member 70' and the insulating film 71', the first and second semiconductor devices 4 and 4' are located as shown in FIG. 2, followed by a thermal press-connecting so that the connecting portions 5 and 5' of the first and second semiconductor devices 5 and 5' are electrically connected to each other through the metallic members 70 and 70'.

The method (5) shown in FIG. 3 is as follows.

This method employs an anisotropic conductive film 78 which is formed by dispersing conductive particles 79 in a conductive material 77 and disposed between a first circuit board 75 and a second circuit board 75'. After locating the first and second circuit boards 75 and 75', these circuit boards are bonded at their connecting portions 76 and 76' by application of pressure with or without simultaneous application of heat.

The method (6) shown in FIG. 4 is as follows.

This method employs an elastic connector 83 which is composed of metal wires 82 such as Fe and Cu embedded in an insulating material 81 and which is provided between first and second circuit boards 75 and 75'. After locating the first and second circuit boards 75 and 75', pressure is applied so that the connecting portions 76 and 76' of the first and second circuit boards 75 and 75' are connected to each other.

The above-described connecting methods, however, suffer from the following problems:

(a) Restrictions in the circuit design due to connecting (b) Too large a pitch of conductors, i.e., too large a distance between the centers of the adjacent conductors (c) Difficulty in reducing thickness of the device (d) Low reliability due to corrosion or breakage of conductors, as well as degradation of the characteristics due to concentration of thermal stress in the region of connecting between the connecting member and the electrical circuit component (e) Difficulty when a defective electrical circuit component is to be replace.

The method shown in FIGS. 1 and 2 has encountered the following problems:

(a) The number of steps is increased and the cost is raised due to necessity for smoothing the exposed surfaces 72 and 73 of the insulating film 71 and the metallic member 70 or the exposed surfaces 71' and 70' of the insulating film 71' and the metallic member 70'.

(b) The quality of the electrical connection between the metallic member 70 and the metallic member 70' is impaired when there is any unevenness of the exposed surfaces 72, 73 of the insulating film 71 and the metallic member 70 or when there is any unevenness of the exposed surfaces 72', 73' of the insulating film 71' and the metallic member 70'.

The method as shown in FIG. 3 encounters with the following problems.

(a) Generally, it is difficult to apply the connecting pressure uniformly to the connecting portion 76, 76' after locating the circuit boards 75 and 75'. This causes a fluctuation in the state of connecting, with the result that the contact resistance in the bonded region fluctuates wildly. In consequence, the reliability of the bond is undesirably impaired. In addition, this connecting method is not suitable for use in the cases where a large electrical current flows, because the supply of large electric current causes significant heat generation in the bonded region.

(b) Fluctuation of the resistance value is unavoidable even if the pressure can be applied uniformly, due to the arrangement of conductive particles 79 in the anisotropic conductive film 78, with the result that the reliability of the bond is impaired. In addition, this method is not suitable for use in the case where the product device is supplied with a large electrical current.

(c) It is difficult to attain a high density of connections because a reduction in the pitch of the connecting portions, i.e., distance between the centers of the connected regions, reduces the resistance between the adjacent connecting portions.

(d) It is necessary that the projected amount $h_1$ of connecting portions 76, 76' from the circuit boards 75, 75' has to be controlled precisely because the resistance value undesirably fluctuates depending on the projected amount $h_1$.

(e) When an anisotropic conductive film is used for the connection between a semiconductor device and a circuit board or between first and second semiconductor devices, it is necessary to form bumps at the connections to the semiconductor devices. In consequence, this causes a disadvantage that the production cost is raised in addition to the above-mentioned problems (a) to (d).

Furthermore, the following problems (a) to (d) are caused when the art shown in FIG. 4 is applied to the connection between a semiconductor device and a circuit board or between first and second semiconductor devices.

(a) It is necessary to employ a specific pressing jig in order to apply the connecting pressure.

(b) The reliability of connection is impaired due to fluctuation in the contact resistance between the metal wire 82 of the elastic connector 83 and the connecting portion 76 of the first circuit board 75 or the connecting portion 76' of the second circuit board 75'.

(c) Since the metallic wires 82 in the elastic connector is basically rigid, there is a risk that the elastic connector 83, the first circuit board 75 and the second circuit board 75' could be broken if too large a connecting pressure is applied thereto. Conversely, a connecting that is too small tends to impair the reliability of the connection.

(d) A fluctuation in the resistance value and the breakage of the circuit boards 75, 75' and the elastic connector 83 tend to be caused by fluctuations in the projected amount $h_2$ of the connecting portions 76, 76' of the circuit boards 75, 75' and the projected amount $h_3$ of the metallic wires 82 of the elastic connector 83.

It is therefore necessary that suitable measures be taken to minimize the fluctuation in the projected amounts.

SUMMARY OF THE INVENTION

Accordingly, an object of the present invention is to provide a method of making an electric circuit device which has a high density of connections and a high degree of reliability, as well as reduced cost, the method being capable of substituting for conventional connecting and sealing methods and providing a multi-point connection of high density, as well as improved thermal and other characteristics.

To this end, according to one aspect of the present invention, there is provided a method of producing an electrical circuit device, comprising the steps of preparing an electrical connecting member including a holding body made of an electrically insulating material and a plurality of electrically conductive members embedded in the holding body, each electrically conductive member having a first end exposed through one side of the holding body and a second end exposed through the other side of the holding body; preparing a first electrical circuit component having connecting portions to which the first ends of the electrically conductive members of the electrically connecting member are to be bonded; preparing a second electrical circuit component having connecting portions to which the second ends of the electrically conductive members of the electrical connecting member are to be bonded; and effecting an internal heating to at least one of a first connecting region between the connecting portions of the first electrical circuit component and the first ends of the electrically conductive members of the electrical connecting member and second connecting regions between the connecting portions of the second electrical circuit component and the second ends of the electrically conductive members of the electrical connecting member, thereby causing alloying in at least one of the first and second connecting regions so as to connect at least one of the first and second electrical circuit components to the electrical connecting member.

BRIEF DESCRIPTION OF THE DRAWINGS

FIGS. 5(a), 5(b), and 5(c)-1 to 5(c)-6 are sectional views of embodiments 1-D1 to 1-E2, wherein, FIG. 5(a) shows these embodiments in a state before connecting, FIG. 5(b) shows the state after the connecting, and FIGS. 5(c)-1 to 5(c)-6 show the states after sealing;

FIGS. 7(a) and 7(b)-1 to 7(b)-6 are illustrations of embodiments 2-D1 to 2-E2, wherein FIG. 7(a) is a perspective view, while FIGS. 7(b)-1 to 7(b)-6 are sectional views;

FIGS. 8(a)-1 to 8(a)-6 are sectional views of embodiments 3-D1 to 3-E2;

FIGS. 8(b)-1 to 8(b)-5 are sectional views of modifications of the embodiments 3-D1 to 3-E1;

FIGS. 9(a)-1 to 9(a)-6 are sectional views of embodiments 4-D1 to 4-E2;

FIGS. 9(b)-1 to 9(b)-4 are illustrations of modifications of the embodiments 4-D1 to 4-D4;

FIGS. 11(a) to 12(b) also shows the embodiment 5 in which, FIGS. 11(a) and 12(a) are perspective views, while FIGS. 11(b) and 12(b) are sectional views;

FIGS. 13(a) and FIGS. 13(b)-1 to 13(b)-6 show embodiments 6-D1 to 6-E2 in which FIG. 13(a) is a perspective view of the embodiment in the state before the connection, while FIGS. 13(b)-1 to 13(b)-6 are sectional views showing the state after the connection;

FIGS. 16(a) and 16(c) are sectional views showing an example of fabrication of an electrical connection member used in embodiment 9 of the present invention, while

Figure 1:
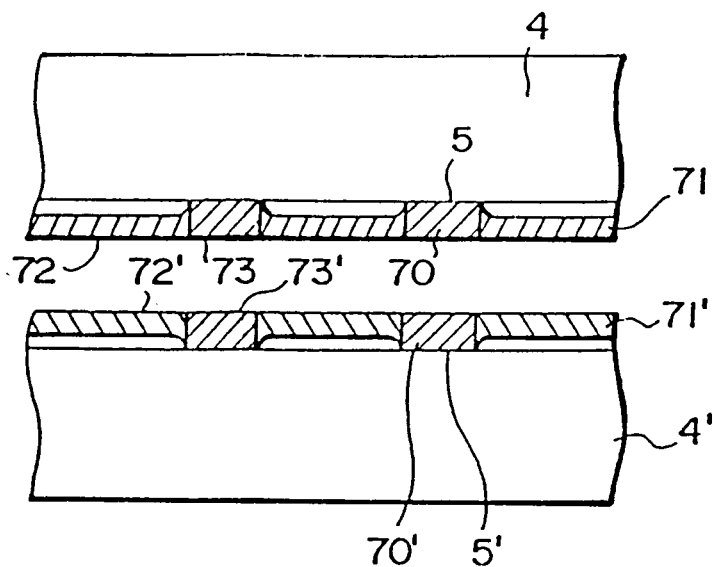
FIGS. 1 to 4 are illustrations of conventional connecting methods.

Other embodiments also are described with reference to these Figures.

DESCRIPTION OF THE PREFERRED EMBODIMENTS

Description will be given first of major constituents or elements used in the method to the present invention.

Electrical Circuit Parts

Electrical circuit components used in the invention are, for example, circuit boards such as resin circuit boards, ceramics circuit boards, metallic circuit boards, silicone circuit boards and so forth (referred to simply as "circuit board" or "circuit board" hereinafter), semiconductor devices and lead frames.

Only one or a plurality of electrical circuit components to be connected by the electrical connecting member may exist on the surface of a holding body.

The electrical circuit device is formed by connecting electrical circuit components having connecting portions. Although no restriction exists in regard to the number of the connecting portions, it is to be understood that the greater the number of the connecting portions, the more remarkable the advantage of the invention.

The position of the connecting portion also is not restricted. However, the invention offers an advantage which is remarkable particularly when the connecting portion exists inside the electrical circuit component, i.e., portions other than the outer periphery.

The connecting portion is made of an electrically conductive material.

The material of the connecting portion has to be bondable and is preferably magnetic and, more preferably ferromagnetic. When a magnetic or ferromagnetic material to be used is not suitable for connecting, it is preferred that a layer of a bondable material is provided on the magnetic or ferromagnetic material by, for example, plating or cladding. When connecting with a magnetic material is difficult, a metallic material may be used as the material of the connecting portion.

Electrical Connecting Member

The electrical connecting member used in the present invention has a plurality of electrically conductive members embedded in a holding body made of an electrically insulating material. The electrically conductive members embedded in the holding body are electrically insulated from one another. One ends of the electrically conductive members are exposed at one side of the holding body, while the other ends are exposed to the other side of the holding body. The electrical connecting member may have the form of a singular layer or to or more layers.

Electrically Conductive Members

Any materials which are electrically conductive may be used as the electrically conductive material used in the present invention, although metals are generally used. Among various metals, gold iis preferably used but other metals and alloys also are usable. Metals and alloys usable are, for example, Ag, Be, Ca, Mg, Mo, Ni, W, Fe, Ti, In, Ta, Zn, Cu. Al, Sn, Pb-Sn, and so on.

The metallic material used as the electrically conductive material is preferably bondable and, more preferably, bondable and magnetic and most preferably bondable and ferromagnetic. When the connecting with a magnetic or a ferromagnetic material is difficult to carry out, it is possible to use, in place of the magnetic or ferromagnetic material, a composite material formed by coating the magnetic or ferromagnetic material with a bondable material by plating or cladding. When the connecting with a magnetic material is impossible, it is possible to use a metallic material. Electrical conductive members of different metals or alloys may be used in a single electrical connecting member, or all the electrically conductive members of the same electrical connecting member may be made of the same metal or alloy. Each of the metallic or alloy members of the electrical connecting member maybe composed of a metal or an alloy or, alternatively, different metals or alloys may be used as the material of each metallic or alloy members. A material formed from a metallic material with an organic and/or an inorganic material dispersed therein may be used as the material of the electrical conductive member provided that good electrical conductivity is exhibited. A combination of an inorganic material and an organic material may be used as the material of the conductive member, provided that such a combination provides required electrical conductivity.

The electrically conductive member may have a circular, a rectangular or any other suitable cross-sectional shape. No restriction is posed on the size of the electrically conductive member. Considering the pitch of the connections of electrical circuit components, the conductive member preferably but not exclusively has a size of 20 $\mu$m or greater in terms of diameter.

The exposed portion of the electrically conductive member may be flush with the surface of the holding body or may be projected therefrom. The projection of the exposed portions may be provided only on one side of the holding body or on both sides of the same. When the exposed portions are projected, the projections may have the form of bumps.

The spacing of the electrically conductive members may be the same as that of the connecting regions of the electrical circuit components or may be smaller the spacing of these connecting regions. In the latter case, it is possible to connect the electrical circuit components and the electrical connecting member without requiring the electrical circuit components to be precisely located with respect to the electrical connecting member. The electrical conductive members need not always be arranged perpendicularly in the holding body but may extend from one to the other side of the holding body in a slanting manner.

Carrier

The holding body is made of an electrically insulating material. Any electrically insulating material may be used for this purpose. Typically, organic or inorganic insulating materials are used. Alternatively, the electrically conductive members of metal or alloy of the electrical connecting material may be coated by anode oxidation, application of an insulating material or the like method such that these electrically conductive members may be insulated from one another. The holding body also may be made of an organic material with dispersion of one or more of an inorganic material, metallic material and an alloy material having a granular, fibrous, tabular, rod-like or spherical forms. The holding body also may be made of an inorganic material with dispersion of one or more of an organic material, metallic material and an alloy material having a granular, fibrous, tabular, rod-like or spherical forms. The holding body also may be made of a metallic material with dispersion of one or more of an inorganic and/or organic material having a granular, fibrous, tabular, rod-like or spherical forms. When the holding body is made of a metallic material, an insulating material such as a resin is disposed between the electrically conductive members and the holding body. For the purpose of effecting a high-frequency induction heating, the holding body is preferably made of a material in which a metallic members are dispersed or a material at least a portion of which is made of a metal and, in such a case, the metallic members of the metal is preferably a magnetic material or a ferromagnetic material.

The organic material mentioned above may be an insulating resin such as a thermosetting resin, ultraviolet setting resin or a thermoplastic resin. Examples of such a resin are: polyimide resin, polyphenylene sulfide resin, polyether sulfone resin, polyether imide resin, polysulfone resin, fluororesin, polycarbonate resin, polydiphenylether resin, polybenzylimidazole resin, polyamideimide resin, polypropylene resin, polyvinylchloride resin, polystyrene resin, methylmethacrylate resin, polyphenylene oxide resin, phenol resin, melanine resin, epoxy resin, urea resin, methacryl resin, vinylidene chloride resin, alkyd resin, and so forth.

Preferably, the resin used has a large value of the product of the specific dielectric constant and the dielectric power factor. Examples of the resin which meets such a demand are vinyl chloride resin, melamine resin, urea resin, phenyl resin, polyurethane resin, epoxy resin, methacryl resin, polyimide resin, vinylidene chloride resin, styrene resin and the like.

Organic material mentioned above is typically a ferroelectric material. Examples of such material are of BaTiO$_3$ group, PbZrO$_3$ group, PbTiO$_3$ group, LiNbO$_3$ group, SrTiO$_3$ group, MgO-TiO$_2$ group, BaO-TiO$_2$ group, La$_2$O$_3$-TiO$_2$ group, CaTiO$_3$ group, CaSnO$_3$ group, BaSnO$_3$ group, BaZrO$_3$ group, MgTiO$_3$ group, Bi$_2$(TiO$_2$)$_3$ group, (Ba-Sr)TiO$_3$ group, (Ba-Ca)TiO$_3$ group, (Ba-Pb)TiO$_3$ group, Ba(Ti-Zr)O$_3$ group, Ba(Ti-Sn)O$_3$ group, PbZrO$_3$-PbTiO$_3$ group, NaNbO$_3$ group, KNbo$_3$ group, LiNbO$_3$ group, Bi$_2$WO$_3$ group, soda silica glass, and other inorganic materials.

Preferably, the resin used has a large heat conductivity so that heat generated by a semiconductor device maybe efficiently transmitted and radiated. It is also preferred that the resin used has a thermal expansion coefficient substantially the same as that of the circuit board. It is also preferred that at least one hole or cavity or a plurality of voids are formed in the organic material so that any tendency for degradation or reduction in the reliability attributable to thermal expansion and contraction can be suppressed.

Practically, the examples of the metal or alloy material are Ag, Cu, Au, Al, Be, Ca, Mg, Mo, Fe, Ni, Si, Co, Mn, W, Cr, Nb, Zr, Ti, Ta, Zn, Sn, Pb-Sn.

Examples of inorganic materials are, for example, ceramics such as SiO$_2$, B$_2$O$_3$, Al$_2$O$_3$, Na$_2$O, K$_2$O, CaO, ZnO, BaO, PbO, Sb$_2$O$_3$, As$_2$O$_3$, La$_2$O$_3$, ZrO$_2$, BaO, P$_2$O$_5$, TiO$_2$, MgO, SiC, BeO, BP, BN, AlN, B$_4$C, TaC, TiB$_2$, CrB$_2$, TiN, Si$_3$N$_4$, Ta$_2$O$_5$ and so forth, as well as other inorganic materials such as diamond, glass, carbon, boron and so forth.

Connecting: Connecting by Metallization and/or Alloying

I. Connecting by Supersonic Heating

Connecting of electrical connecting member to electric circuit components can have either one of the following forms. Two or more electrical circuit components may be bonded to one end of a single electrical connecting member. In such a case, at least one of the electrical circuit component has to meet one of the following forms.

(1) One ends of a plurality of electrically conductive members exposed on one end of the holding body are connected to at least one of a plurality of connecting portions of one of an electric circuit component by metallization and/or alloying effected chiefly by internal heating by supersonic heating method. Meanwhile, the other ends of the electrically conductive members exposed at the other side of the holding body are connected to a plurality of connecting portions of the other electrical circuit component by a method other than metallization and alloying.

(2) One ends of a plurality of electrically conductive members exposed on one end of the holding body are connected to at least one of a plurality of connecting portions of an electrical circuit component by metallization and/or alloying effected chiefly by internal heating by supersonic heating method. At the same time, the other ends of a plurality of electrically conductive members exposed on one end of the holding body are connected to at least one of a plurality of connecting portions of another electrical circuit component by metallization and/or alloying effected chiefly by internal heating by supersonic heating method.

The connecting by metallization and/or alloying by internal heating effected by supersonic heating is conducted as follows. Namely, high-frequency vibration from the exterior is supplied to one or the other surface of the electrically conductive member so that a temperature rise is caused in the connecting interface due to molecular friction, whereby the interface is metallized and/or alloyed to bond the electrically conductive member and the electrical circuit component.

Factors such as frequency, amplitude, direction and so forth of the high-frequency vibration may be suitably determined in accordance with experimental conditions.

Although the connecting is effected chiefly by supersonic heating, it is possible to simultaneously conduct another internal heating method or an external heating method in order to promote the effect produced by the supersonic heating.

A description will be given of the connecting by metallization and/or alloying caused by the supersonic heating method.

When the electrically conductive member and the connecting portion are of the same pure metal, the connecting layer formed through metallization has the same crystalline structure as the electrically conductive member or the connecting portion.

In contrast, when the electrically conductive member and the connecting portion are of different pure metals, the connecting layer formed therebetween has a structure as an alloy of both metals.

Likewise, an alloy structure is obtained in the connecting layer when one of the electrically conductive member and the connecting portion is of a pure metal while the other is of an alloy or when both of them are the same or different alloys.

As stated before, a plurality of electrically conductive members in a single electrical connecting member may be of the same metal or alloy or of different metals or alloys or else. In addition, each of the electrically conductive may be composed of a metal or an alloy, plurality of metals or alloys or else. These apply also to the case of the connecting portion. Anyway, the connecting is achieved by metallization or alloying.

It is not always necessary that the electrically conductive member or the connecting portion is wholly made of a metal/metals or alloy/alloys. Namely, what is required is that the electrically conductive member or the connecting portion has a metal or alloy structure at at least the region where it contacts with the other. Thus, other portion of the electrically conductive member or the connecting portion maybe composed of a metal with a dispersion of an inorganic material such as a glass or a dispersion of an organic material.

The arrangement may be such that the contact region of the electrically conductive member or the connecting portion is plated with a metal which is easy to be alloyed.

The connecting by a method other than metallization and alloying may be effected by, for example, pressing an electrically conductive member of the electrical connecting member to the connecting portion of an electrical circuit component.

II. Connecting by High-Frequency Induction Heating

Connecting of electrical connecting member to electric circuit components can have either one of the following forms. Two or more electrical circuit components may be bonded to one end of a single electrical connecting member. In such a case, at least one of the electrical circuit component has to meet one of the following forms.

(1) One ends of a plurality of electrically conductive members exposed on one end of the holding body are connected to at least one of a plurality of connecting portions of one of an electric circuit component by metallization and/or alloying effected chiefly by internal heating by high-frequency induction heating method. Meanwhile, the other ends of the electrically conductive members exposed at the other side of the holding body are connected to a plurality of connecting portions of the other electrical circuit component by a method other than metallization and alloying.

(2) One ends of a plurality of electrically conductive members exposed on one end of the holding body are connected to at least one of a plurality of connecting portions of an electrical circuit component by metallization and/or alloying effected chiefly by internal heating by high-frequency induction heating method. At the same time, the other ends of a plurality of electrically conductive members exposed on one end of the holding body are connected to at least one of a plurality of connecting portions of another electrical circuit component by metallization and/or alloying effected chiefly by internal heating by high-frequency induction heating method.

Thus, the connecting in the method of the present invention may be attained by metallization or alloying caused by an internal heating effected mainly by high-frequency induction heating.

The principle of high-frequency induction heating will be briefly described hereinafter. Electromagnetic energy of a high frequency is applied to the electrically conductive member or the insulator of the electrical connecting member or to the metallic material in the boding portion of the electrical circuit component to be bonded. In consequence, a high-frequency voltage is induced in such a metallic material so that eddy current are generated in these materials. This eddy current produces Joule heat due to electrical resistance of the metallic material.

In the event that the metallic material is a ferromagnetic material, heat known as hysteresis heat is generated in addition to the Joule heat. This heat is generated as a result of friction of molecules caused by vibration of molecular magnets in response to periodic inversion of the magnetic field.

Thus, the high-frequency energy is converted into heat energy within the metallic material. In consequence, one or more of the electrically conductive member of the electrical connecting member, insulator of the electrical connecting member and the electrical circuit component are heated. When the temperature of the insulator is higher than that of the electrically conductive member or when the temperature of the electrical circuit component is higher than that of the electrical conductive member, the heat is transmitted to the connecting region between the electrically conductive member and the electrical circuit component, so that metallization or alloying is effected at the interface between the connecting portion of the electrical circuit component and the exposed portion of the electrically conductive member of the electrical connecting member, whereby the electrically connecting member is bonded to the electrical circuit component.

The metallization and/or alloying causes the metal or metals to be diffused. If the metallization takes place in the boundary between two metal members of the same metallic material, a crystalline structure which is the same as that of the metallic member is obtained. If these metallic members are of different metals, a structure such as a solid solution or an intermetallic compound is formed.

The heat energy produced by eddy currents is determined as follows:

$$P \propto (\rho \mu f)^{\frac{1}{2}}$$

where,
P: Heat energy produced per unit time
$\rho$: Specific electric resistance of metallic material
$\mu$: Magnetic permeability of metallic material
f: Frequency Conditions of the high-frequency induction heating such as the frequency, as well as the conditions of the heating equipment, may be determined through experiments.

Although the connecting is effected chiefly by high-frequency heating, it is possible to simultaneously conduct another internal heating method or an external heating method in order to promote the effect produced by the high-frequency heating.

A description will be given of the connecting by metallization and/or alloying caused by the high-frequency induction heating method.

When the electrically conductive member and the connecting portion are of the same pure metal, the connecting layer formed through metallization has the same crystalline structure as the electrically conductive member or the connecting portion.

In contrast, when the electrically conductive member and the connecting portion are of different pure metals, the connecting layer formed therebetween has a structure as an alloy of both metals.

Likewise, an alloy structure is obtained in the connecting layer when one of the electrically conductive member and the connecting portion is of a pure metal while the other is of an alloy or when both of them are the same or different alloys.

As stated before, a plurality of electrically conductive members in a single electrical connecting member may be of the same metal or alloy or of different metals or alloys or else. In addition, each of the electrically conductive may be composed of a metal or an alloy, plurality of metals or alloys or else. These apply also to the case of the connecting portion. Anyway, the connecting is achieved by metallization or alloying.

It is not always necessary that the electrically conductive member or the connecting portion is wholly made of a metal/metals or alloy/alloys. Namely, what is required is that the electrically conductive member or the connecting portion has a metal or alloy structure at at least the region where it contacts with the other. Thus, other portion of the electrically conductive member or the connecting portion maybe composed of a metal with a dispersion of an inorganic material such as a glass or a dispersion of an organic material.

The arrangement may be such that the contact region of the electrically conductive member or the connecting portion is plated with a metal which is easy to be alloyed.

The connecting by a method other than metallization and alloying may be effected by, for example, pressing an electrically conductive member of the electrical connecting member to the connecting portion of an electrical circuit component.

III. Connecting by High-Frequency Dielectric Heating or Microwave Heating

Connecting of electrical connecting member to electric circuit components can have either one of the following forms. Two or more electrical circuit components may be bonded to one end of a single electrical connecting member. In such a case, at least one of the electrical circuit component has to meet one of the following forms.

(1) One ends of a plurality of electrically conductive members exposed on one end of the holding body are connected to at least one of a plurality of connecting portions of one of an electric circuit component by metallization and/or alloying effected chiefly by internal heating by high-frequency dielectric heating method or microwave heating method. Meanwhile, the other ends of the electrically conductive members exposed at the other side of the holding body are connected to a plurality of connecting portions of the other electrical circuit component by a method other than metallization and alloying.

(2) One ends of a plurality of electrically conductive members exposed on one end of the holding body are connected to at least one of a plurality of connecting portions of an electrical circuit component by metallization and/or alloying effected chiefly by internal heating by high-frequency dielectric heating method or microwave heating method. At the same time, the other ends of a plurality of electrically conductive members exposed on one end of the holding body are connected to at least one of a plurality of connecting portions of another electrical circuit component by metallization and/or alloying effected chiefly by internal heating by high-frequency dielectric heating method or microwave heating method.

Thus, the connecting in the method of the present invention may be attained by metallization or alloying through directly or indirectly heating the connecting region by an internal heating effected mainly by high-frequency dielectric heating or microwave heating.

The principle of the high-frequency dielectric heating will be described hereinafter. Most of the molecules which form at least a part of the electrically insulating holding body of the electrical connecting member or a dielectric region of at least a portion of the electrical circuit component are dipoles which have positive and negative charges at their both ends. Thus, the dielectric parts are considered as aggregates of such dipoles. These dipoles are oriented at random when no electric field exists. However, when an electric field is applied, the positive and negative charges are attracted and repelled by the charges of the electrodes of the electric field so that the dipoles are oriented in conformity with the direction of the electric field. When the electric field is of a high frequency, the polarity of the electric field is switched at a high frequency so that the directions of the dipoles are changed at the high frequency. During switching of the orientation of the molecules of the dielectric part, the molecules in the form of dipoles are made to collide and friction with one another thereby generating heat.

The heat energy generated in the material as a result of the high-frequency dielectric heating can be expressed as follows.

$$P \propto \epsilon \cdot \tan \delta \cdot f$$

where,
$\epsilon$: Specific dielectric constant of substance
$\tan \delta$: Dielectric power factor of substance
$f$: Frequency The heat thus generated in at least a portion of the electrical connecting member or of the electrical circuit component is transmitted to the electrical conductive member of the electrical connecting member or to the connecting portion of the electrical circuit component, so that the connecting region between the electrically conductive member and the electrical circuit component is heated to form a metallized or alloyed structure thereby attaining the connecting.

The metallization or alloying causes diffusion of two metals. Thus, when two metallic members of the same metal are bonded, a crystalline structure same as that of these metallic members is formed in the connecting region. If these metallic members are of different metals, a structure such as a solid solution or an intermetallic compound is formed.

The microwave heating method relies substantially on the same principle as the high-frequency heating. Microwave heating, however, produces the following effects different from those of high-frequency heating because of the much higher frequency.

(1) Heating is possible without requiring any electrode.

(2) Heat generation is possible even with infinite and complicated form of the dielectric part.

(3) Heat generation is possible even when the material exhibits electrical conductivity due to electrolytic component.

(4) A significant temperature gradient may be developed between the surface and the core part of the heated object because the penetration depth is reduced as the dielectric loss factor (product of $\epsilon$ and $\tan \delta$) increases.

Anyway, whether an ordinary high frequency dielectric heating or the microwave heating frequency is used is determined in accordance with conditions.

Although the connecting is effected chiefly by high-frequency heating or microwave heating, it is possible to simultaneously conduct both heating methods or another internal heating method or an external heating method in order to enhance the effect produced by the high-frequency heating.

A description will be given of the connecting by metallization and/or alloying caused by the high-frequency dielectric heating or microwave heating method.

When the electrically conductive member and the connecting portion are of the same pure metal, the connecting layer formed through metallization has the same crystalline structure as the electrically conductive member or the connecting portion.

In contrast, when the electrically conductive member and the connecting portion are of different pure metals, the connecting layer formed therebetween has a structure as an alloy of both metals.

Likewise, an alloy structure is obtained in the connecting layer when one of the electrically conductive member and the connecting portion is of a pure metal while the other is of an alloy or when both of them are the same or different alloys.

As stated before, a plurality of electrically conductive members in a single electrical connecting member may be of the same metal or alloy or of different metals or alloys or else. In addition, each of the electrically conductive may be composed of a metal or an alloy, plurality of metals or alloys or else. These apply also to the case of the connecting portion. Anyway, the connecting is achieved by metallization or alloying.

It is not always necessary that the electrically conductive member or the connecting portion is wholly made of a metal/metals or alloy/alloys. Namely, what is required is that the electrically conductive member or the connecting portion has a metal or alloy structure at at least the region where it contacts with the other. Thus, other portion of the electrically conductive member or the connecting portion maybe composed of a metal with a dispersion of an inorganic material such as a glass or a dispersion of an organic material.

The arrangement may be such that the contact region of the electrically conductive member or the connecting portion is plated with a metal which is easy to be alloyed.

The connecting by a method other than metallization and alloying may be effected by, for example, pressing an electrically conductive member of the electrical connecting member to the connecting portion of an electrical circuit component.

Thus, the internal heating method such as the supersonic heating method, high-frequency induction heating method, high-frequency dielectric heating method, microwave heating method and so forth maybe used alone or in combination. It is also possible to use one or more of these internal heating method together with a heat-connecting method or other suitable external heating method.

Sealing Material

According to the invention, an electric circuit component of the electrical circuit may be sealed by embedding the same in a sealing material.

The sealing may be conducted on one of the electrical circuit component or on a plurality of electrical circuit components.

Material Used for Sealing

The sealing material used in the present invention may be a thermoplastic resin. Examples of such a thermoplastic resin are polyimide resin, polyphenylene sulfide resin, polyether sulfone resin, polyether imide resin, polysulfone resin, fluororesin, polycarbonate resin, polydiphenylether resin, polybenzylimidazole resin, polyamideimide resin, polypropylene resin, polyvinyl chloride resin, polystyrene resin, methylmethacrylate resin, and so forth.

One of the above-mentioned thermoplastic resins may be used without any dispersion or, alternatively, one or more kinds of a metal, alloy or an inorganic material of a suitable form such as granular, fibrous, tabular, rod, spherical form may be dispersed in the thermoplastic resin. Such a dispersion may be formed by adding to the resin material the metal, alloy and/or the inorganic material in the granular, fibrous, tabular, rod or spherical form and kneading the resin material together with these added materials. This method, however, is only illustrative and the dispersion may be effected by other suitable method.

Examples of the metal or alloy which can be dispersed in the thermoplastic resin are Ag, Cu, Au, Al, Be, Ca, Mg, Mo, Fe, Ni, Si, Co, Mn, W and so forth.

Examples of inorganic material which can be dispersed in the thermoplastic resin are ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$ and so forth, as well as diamond, glass, carbon, boron and other inorganic materials.

The size and shape of the dispersed granules or fibers, as well as position of the dispersion and quantity of the same, may be freely determined provided that the granular or fibrous matters dispersed in the thermoplastic resin do not cause mutual contact or short-circuiting between metallic members embedded in the insulating member. It is, however, preferred that the size of the dispersed matters in the granular, fibrous, tabular, rod or spherical form is smaller than the pitch or distance between the adjacent metallic members. Namely, it is preferred that the size of these matters is determined so as not to allow mutual contact of the electrical conductive members through such granular, fibrous, tabular, rod or spherical matters. The granular or fibrous matters dispersed may or may not be exposed to the exterior of the insulating member. The granular, fibrous, tabular, rod or spherical matters dispersed may or may not contact one another. Thus, sealing may be effected with a resin in which granular, fibrous, tabular, rod or spherical matters are dispersed.

Sealing Method

The sealing may be conducted by placing an electrical circuit module (composed of an electrical connecting member and an electrical circuit component bonded thereto) in a mold cavity, and filling the cavity with a molten resin by injection molding. The use of injection molding is only illustrative and the sealing may be effected by a method such as extrusion molding, core molding, blow forming or other suitable method.

It is also possible to use the sealing material together with a plate of a material different from the sealing material.

The plate may be used in various manners. For instance, the plate may be connected to at least a portion of the surface of the sealing material. In another case, the plate is connected, at the side opposite to the electrical connecting member, to at least a portion of at least one of an electrical circuit component and another electrical circuit component bonded to the electrical connecting member, the plate being at least partially embedded in the sealing material. In still another case, the plate is disposed in the vicinity of a side surface of at least one of an electrical circuit component or another electrical circuit component bonded to an electrical connecting member, the plate being at least partially embedded in the sealing material.

Plate

Any material different from the sealing material may be used as the material of the plate.

When a stainless steel is used as the plate material, the thickness of the plate preferably ranges between 0.05 and 0.5 mm.

The method of connecting the plate is not restricted. For instance, adhesion with an adhesive is suitably adopted. Other methods also are usable provided that the plate can support the electrical circuit device.

Cap

Electrical circuit component used in the present invention may be sealed by a cap.

The sealing with a cap means that an electrical circuit component is enveloped with a cap member such that it is sealed by the cap with a free space left around the electrical circuit component.

The arrangement may be such that each electrical circuit component is sealed with a cap or a cap may be used for sealing two or more electrical circuit components. The sealing with a cap is preferably conducted such that the electrical circuit component is securely held by the electrical connecting member. For instance, the arrangement may be such that the cap has an internal configuration substantially conforming with the outer configuration of the electrical circuit component and the cap is attached such that the inner surfaces thereof materially contacts the outer surfaces of the electrical circuit component.

The cap may be fixed to the electrical circuit component by adhesion, mechanical fixing method, welding or the like method. When electrical circuit components on both sides of the holding body of the electrical connecting member are sealed with caps, these caps may be fixed to each other by adhesion, mechanical fixing method or welding.

Cap Material

The cap may be made of an organic material, an inorganic material, a metallic material or a composite material composed by to or more of these materials.

The arrangement may be such that a single electrical circuit component is sealed with a single cap or a plurality of electrical circuit components are sealed with a common cap. The cap may be provided in such a manner as to press an electrical circuit component or to support the same. It is possible to use an intermediate member between a cap and an electrical circuit component or parts sealed with the cap. The advantage of provision of such an intermediate member is remarkable particularly when a plurality of electrical circuit components are sealed with a common cap.

The described method of connection between the cap and the electrical circuit component or parts may be effected by any desired method, through some of them are mentioned above.

Adjusting Member

According to the invention, an adjusting member may be placed between a cap and an electrical circuit component and a cap. The adjusting member may be of a metallic material, an inorganic material or an organic material. Preferably, the material is elastic. The adjusting member can have any suitable shape, provided that it can adjust the heightwise size of the electrical circuit component.

According to the present invention, an electrical circuit is formed by connecting an electrical circuit component to another electrical circuit component through an electrical connecting member having the above-described features. Therefore, an electrical circuit component can be bonded at any portion thereof, i.e., not only at a peripheral portion but also at an inner portion thereof. This enables the number of the connecting regions to be increased, contributing to an enhancement in the density.

The electrical connecting member, which inherently has a small thickness, makes it possible to realize a very thin electrical circuit device.

In addition, the connecting is possible with a very small amount of metal in the connecting member. Therefore, the production cost is not significantly raised even when an expensive metal such as gold is used as the metal in the electrical connecting member.

According to an embodiment of the present invention, the electrical connecting member has at least one electrical conductive member and a holding body embedding the electrical conductive member such that the conductive member has ends exposed in one and the other side of the holding body. The end of the electrical conductive member exposed on one side of the holding body is bonded to a connecting portion of an electrical circuit component, while the other end exposed in the other side of the holding body is bonded to a connecting region of another electrical circuit component. The connecting is effected mainly by internal heating caused by application of a supersonic wave at one or both sides of the holding body of the electrical connecting member. Therefore, the connecting can safely be achieved without any degradation o deterioration of parts which are liable to be thermally affected, even if such parts exist in the vicinity of the electrical circuit component to be bonded, whereby an electrical circuit device having a high degree of reliability can be obtained.

In another embodiment of the present invention, the electrical connecting member has at least one electrical conductive member and a holding body embedding the electrical conductive member such that the conductive member has ends exposed in one and the other side of the holding body. The end of the electrical conductive member exposed on one side of the holding body is bonded to a connecting portion of an electrical circuit component, while the other end exposed in the other side of the holding body is bonded to a connecting region of another electrical circuit component. The connecting is effected mainly by internal heating caused by high-frequency induction heating at one or both sides of the holding body of the electrical connecting member. Therefore, the connecting can safely be achieved without any degradation or deterioration of parts which are liable to be thermally affected, even if such parts exist in the vicinity of the electrical circuit component to be bonded, whereby an electrical circuit device having a high degree of reliability can be obtained. However, if any part or parts liable to be thermally affected exist in the vicinity of the electrical circuit to be bonded, it is advisable that a suitable shield means be formed so as not to allow high-frequency electromagnetic field to leak to such parts.

In still another embodiment of the present invention, the electrical connecting member has at least one electrical conductive member and a holding body embedding the electrical conductive member such that the conductive member has ends exposed in one and the other side of the holding body. The end of the electrical conductive member exposed on one side of the holding body is bonded to a connecting portion of an electrical circuit component, while the other end exposed in the other side of the holding body is bonded to a connecting region of another electrical circuit component. The connecting is effected mainly by internal heating caused by high-frequency dielectric heating or microwave heating at one or both sides of the holding body of the electrical connecting member. Therefore, the connecting can safely be achieved without any degradation o deterioration of parts which are liable to be thermally affected, even if such parts exist in the vicinity of the electrical circuit component to be bonded, whereby an electrical circuit device having a high degree of reliability can be obtained.

Furthermore, it is possible to reduce any unfavorable effect on the electric circuit component or members in the vicinity of such part, e.g., thermal expansion or contraction.

Furthermore, since a high-frequency electromagnetic field can be applied uniformly, the heating takes place uniformly over the connecting area. Furthermore, the connecting can be accomplished without substantial difficulty because the heating is conducted in a non-contacting manner without requiring any heating jig.

In an embodiment of the present invention, at least a portion of the electrical circuit device is sealed with a sealing material. In such a case, any suitable sealing method can be used by virtue of the fact that the electrically conductive members embedded in the holding body of the electrical connecting member are free from influences of sealing pressure and sealing speed. That is, the sealing may be effected by injection with an extremely high injection pressure which could never be used in conventional methods.

In a specific form of the present invention, a plate is used in various manners. For instance, the plate is connected to at least a portion of the surface of the sealing material. In another case, the plate is connected, at the side opposite to the electrical connecting member, to at least a portion of at least one of an electrical circuit component and another electrical circuit component bonded to the electrical connecting member, the plate being at least partially embedded in the sealing material. In still another case, the plate is disposed in the vicinity of a side surface of at least one of an electrical circuit component or another electrical circuit component bonded to an electrical connecting member, the plate being at least partially embedded in the sealing material.

When such a plate is used, concentration of internal stress, attributable to any internal or external force, is avoided thereby preventing cracking and other detrimental effect which may otherwise be caused on the electrical circuit device. The plate also increases the physical distance between the electrical circuit component and environment, thus suppressing invasion of water into the electrical circuit, thereby offering high reliability of the electrical circuit device.

When the plate is made of a metal such as a stainless steel, a ceramics material having a high heat conductivity, carbon and diamond, it is possible to easily dissipate heat generated by the internal electrical circuit component, whereby a circuit device having a high heat-radiation characteristic is obtained. When the plate is made of a metal, it also serves as a barrier for excluding external noise, as well as electromagnetic noise generated in the circuit device, whereby the electric circuit device can operates with good operation characteristics without being influenced by noise.

In a specific embodiment of the invention, electrical circuit component or parts are sealed with a cap which is hollow. The hollow of the cap serves to suppress generation of thermal stress even when the electrical circuit device is used under a severe thermal condition. The cap maybe made of a material having high heat conductivity and may be placed in contact with the electrical circuit component. In such a case, heat generated by the electrical circuit component can be dissipated quickly through the cap, so that the electrical circuit device having good heat radiation characteristic can be obtained. When the cap is made of a material having a good noise shielding effect, in particular a metal such as iron, an electrical circuit device having high shielding effect can be obtained. Use of an adjusting member placed between the cap and the electrical circuit component enables an efficient assembly work even when differences of height exists among the electrical circuit components.

According to the invention, the insulating member on the electrically conductive member of the electrical connecting member may be made of a material having a high heat conductivity. When a sealing material is used, such a sealing material may contain granular, fibrous, tabular, rod or spherical fillers of a material having a high heat conductivity dispersed in the sealing material. In such cases, heat generated by electrical circuit component or parts is efficiently dissipated so as to improve the heat radiation characteristic of the electrical circuit device.

The insulating holding body of the electrical connecting member may be made of a material having a thermal expansion coefficient approximating that of the electrical circuit component. When a sealing material is used with dispersion of granular, fibrous, tabular, rod or spherical fillers dispersed therein, such fillers may be of a material having a thermal expansion coefficient approximating that of the electrical circuit component. In such a case, the electrical connecting member and the sealing material exhibit thermal expansion and contraction well conforming with those of the electrical circuit component, thus suppressing detrimental effects such as cracking of the sealing material or the electrical circuit component itself, degradation of operation characteristics of the electrical circuit component, and so forth, thereby ensuring high degree of reliability of the electrical circuit device.

According to the prevent invention, both of the pair of electrical circuit components may be mutually connected through an electrical connecting member by metallization or alloying. In such a case, electrical circuit components are securely, i.e., mechanically strongly, bonded with reduced electrical resistance and reduced fluctuation in the resistance value, whereby rate of generation of unacceptable products can be reduced.

The connecting by metallization or alloying of metallurgical structures at the connecting portion of an electrical circuit component eliminates any necessity for jigs which may otherwise be necessitated for the purpose of holding electrical circuit components during and after the formation of the electrical circuit device, thus facilitating storage and handling of the electrical circuit device as the product.

When the connecting by metallization or alloying is adopted at both sides of the electrical connecting member, i.e., between each electrical circuit component and the adjacent end of the conductor of the electrical connecting member, the electrical resistance of the electrical circuit device is reduced as compared with the case where the connecting by metallization or alloying is adopted only at one end of the electrical connecting member.

Conversely, adoption of connecting method other than metallization or alloying at one or the other end of the electrical connecting member eliminates any degradation of the electrical circuit component which may otherwise be caused by the heat generated during metallization or alloying process. In some cases, it is desired that at least one of the electrical circuit component is connected in a detachable manner. The use of a connection method by other means that metallization or alloying at one end of the electrical connecting member well copes with such a demand.

Furthermore, when a material having a large shielding effect is used as the insulating material, it is possible to reduce electromagnetic noise generated by the electrical circuit component, while minimizing influence of external noise which may adversely affect the electrical circuit component.

EXAMPLE 1-D1

Example 1-D1 will be described with reference to FIGS. 5(a), 5(b), 5(c)-1 and FIGS. 6(a) to 6(c).

An electrical circuit device produced by this embodiment has the following components:

An electrical connecting member 125 which has a holding body 111 made of an organic material and a plurality of metallic members 107 as electrically conductive members embedded in the holding body 111, the metallic members 107 being exposed at their one ends in one side of the holding body 111 and at their other ends in the other side of the holding body 111;

a semiconductor device 101 having connecting regions 102 at which it is bonded, through metallizing or alloying effected by supersonic heating, to ends of the metallic members exposed in one side of the holding body 111;

a circuit board 104 having connecting regions 105 at which it is bonded, through metallizing or alloying effected by supersonic heating, to the other ends of the metallic members exposed in the other side of the holding body 111; and a sealing material 170 with which both the semiconductor device 101 and the circuit board 104 are sealed.

Example 1-D1 will be described in more detail.

The nature of the electrical connecting member 125, as well as an example of a process for preparing this electrical connecting member, will be explained with reference to FIGS. 6(a) to 6(c).

Figure 6A:
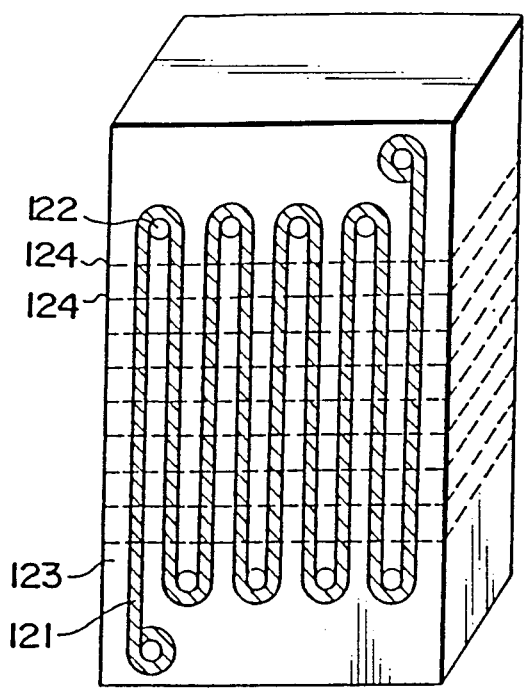
FIGS. 6(a) to 6(c) are sectional views, a perspective view and another sectional view of an electrical connecting member used in the embodiments 1-D1 and 1-E2, illustrating a method of preparing the electrical connecting member.

Referring first to FIG. 6(a), a metallic wire 121 made of, for example, Al or a suitable alloy and having a diameter of 20 μm, was wound on a rod 122 at a pitch of 40 μm. After the winding, the above-mentioned metallic wire 121 was embedded in, for example, a resin 123 such as a polyimide resin. The resin 123 was then cured and set so that the set resin 123 served as an insulator. The resin was then sliced as indicated by broken lines 124 so that a plurality of electrical connecting member 125 were formed. FIGS. 6(b) and 6(c) show one of the electrical connecting member.

In the thus formed electrical connecting member 125, the fractions of the metallic wire 121 constitute the metallic members 107, while the insulating resin 123 serves as the holding body 111.

It will be seen that the fractions of the metal wire 121, i.e., the metallic members 107, are insulated from one another by the resin 123. The metallic members 107 as the fractions of the metallic wire 121 are exposed at their one ends in the surface of the holding body 111 adjacent to the semiconductor device 101 and at their other ends in the surface of the holding body 11 adjacent to the circuit board 104. These exposed portions of the metallic members serve as connecting portions 108, 109 where the electrical connecting member 125 is to be bonded both to the semiconductor device 101 and the circuit board 104.

Figure 5A:
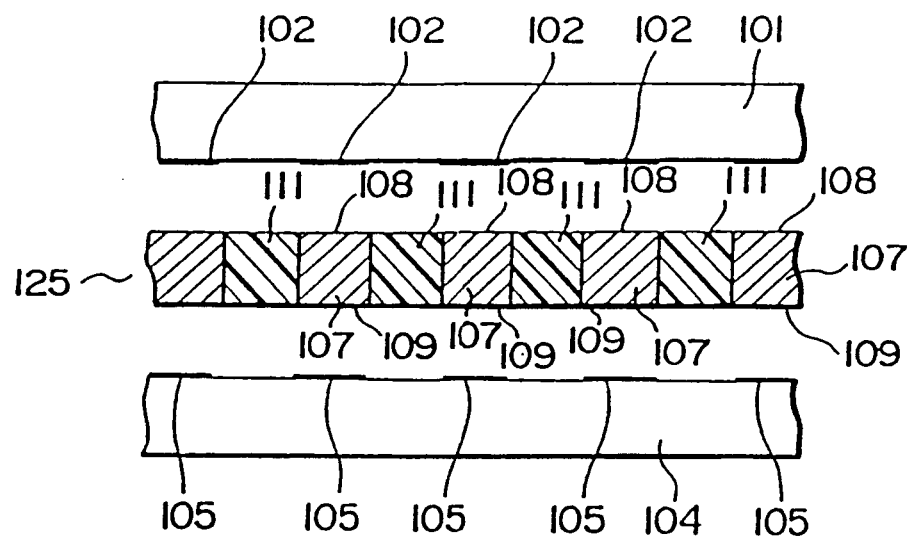

Then, the semiconductor device 101, the electrical connecting member 125 and the circuit board 104 were arranged in a manner shown in FIG. 5(a). The semiconductor device 101 and the circuit board 104 have a plurality of connecting portions 102 and 105 located at portions other than the outer peripheries thereof.

It will also be seen that the positions of the connecting portions 102 of the semiconductor device 101 were determined to correspond to the connecting portions 105 of the circuit board 104, as well as to the connecting portions 108, 109 of the electrical connecting member 125.

Figure 5B:
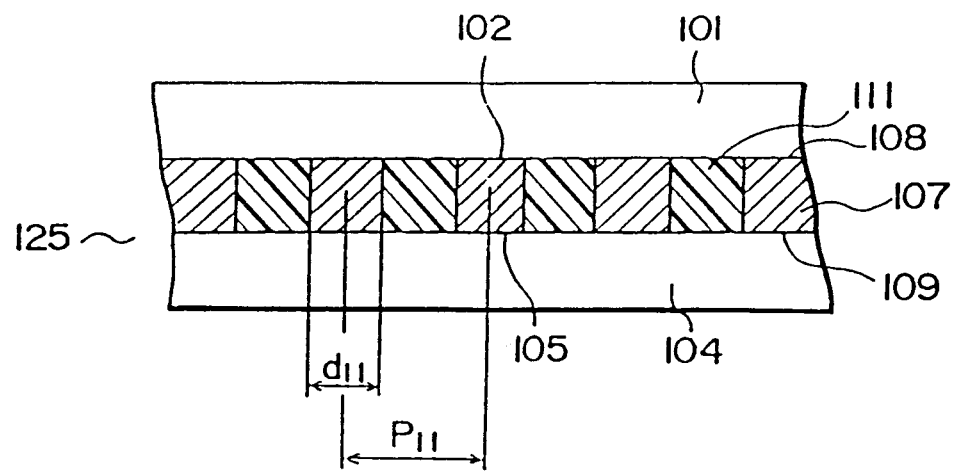

The semiconductor device 101, the electrical connecting member 125 and the circuit board 104 are set such that positional alignment is attained between the connecting portions 102 of the semiconductor device 101 and the connecting portions 108 of the electrical connecting member 125 and/or between the connecting portions 105 of the circuit board 104 and the connecting portions 109 of the electrical connecting member 125. After the setting, supersonic heating was conducted both on the region where the Al material of the connecting portions 102 of the semiconductor device 101 and the Al material of the connecting portions 108 of the electrical connecting member 125 contact each other and the region where the Al material of the connecting portions 109 of the electrical connecting member 125 contacts the Au material of the connecting portions 105 of the circuit board 104, so that metallizing or alloying occurred in each of these regions, whereby the semiconductor device 101 and the circuit board 104 were bonded to each other through the electrical connecting member, as shown in FIG. 5(b). Factors such as the power level, frequency and direction of the supersonic wave were determined through experiments.

The connecting of the semiconductor device 101 and the circuit board 104 through the electrical connecting member 125 by metallizing or alloying may be conducted in accordance with one of the following three methods.

(1) After setting the semiconductor device 101, electrical connecting member 125 and the circuit board 104 as described, metallizing and/or alloying is effected simultaneously both at the regions where the connecting regions 102 of the semiconductor device 101 and the connecting regions 108 of the electrical connecting member 125 contact each other and regions where the connecting portions 105 of the circuit board 104 and the connecting portions 109 of the electrical connecting member 125 contact each other.

(2) After setting the semiconductor device 101 and the electrical connecting member 125, metallizing and/or alloying is effected on the regions where the connecting regions 102 of the semiconductor device 101 and the connecting regions 108 of the electrical connecting member 125 contact each other, thereby connecting the semiconductor device 101 and the electrical connecting member to each other. Then, the circuit board 104 is positioned and the metallizing and/or alloying is executed on the regions where the connecting portions 105 of the circuit board 104 and the connecting portions 109 of the electrical connecting member 125 contact each other, whereby the circuit board 104 is bonded.

(3) After setting the circuit board 104 and the electrical connecting member 125, metallizing or alloying is executed at the regions where the connecting portions 105 of the circuit board 104 and the connecting portions 109 of the electrical connecting member 125 contact each other, whereby the circuit board 104 is bonded to the electrical connecting member 125. Then, the semiconductor device 101 is positioned and the metallizing and/or alloying is effected at the regions where the connecting regions 102 of the semiconductor device 101 and the connecting regions 108 of the electrical connecting member 125 contact each other, thereby connecting the semiconductor device 101 to the electrical connecting member 125.

Figures 1, 5C:
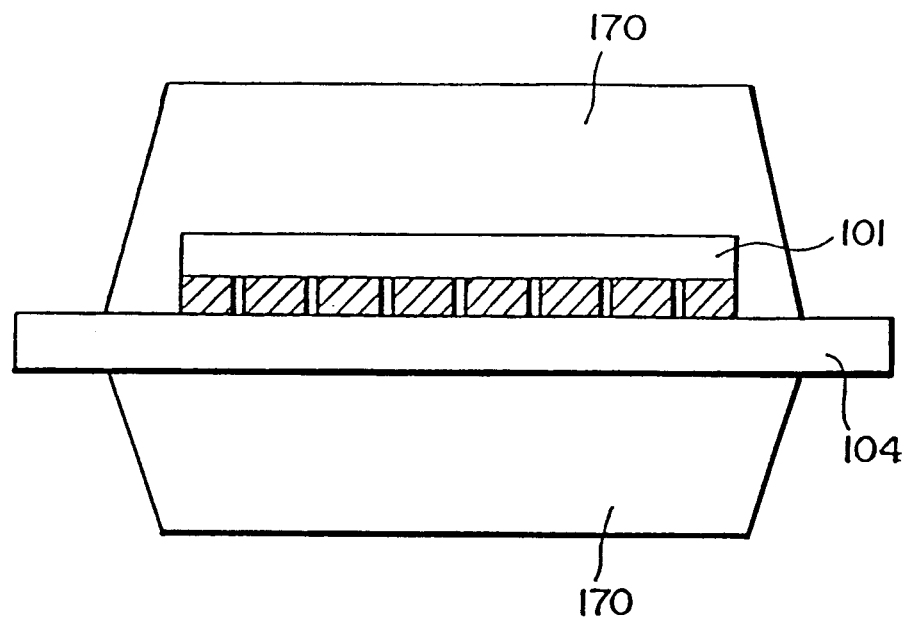
Figures 2, 5C:
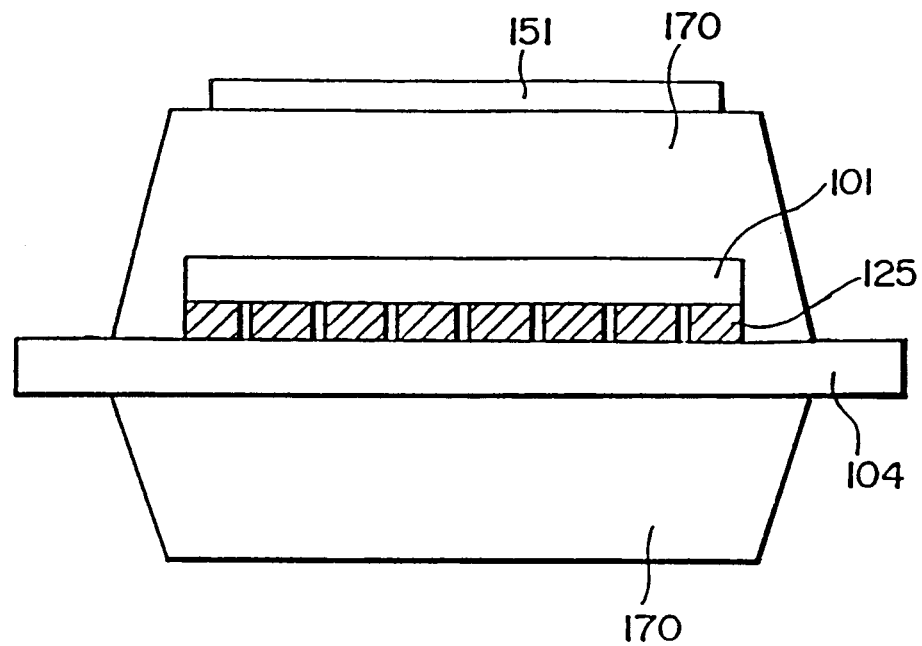
Figures 3, 5C:
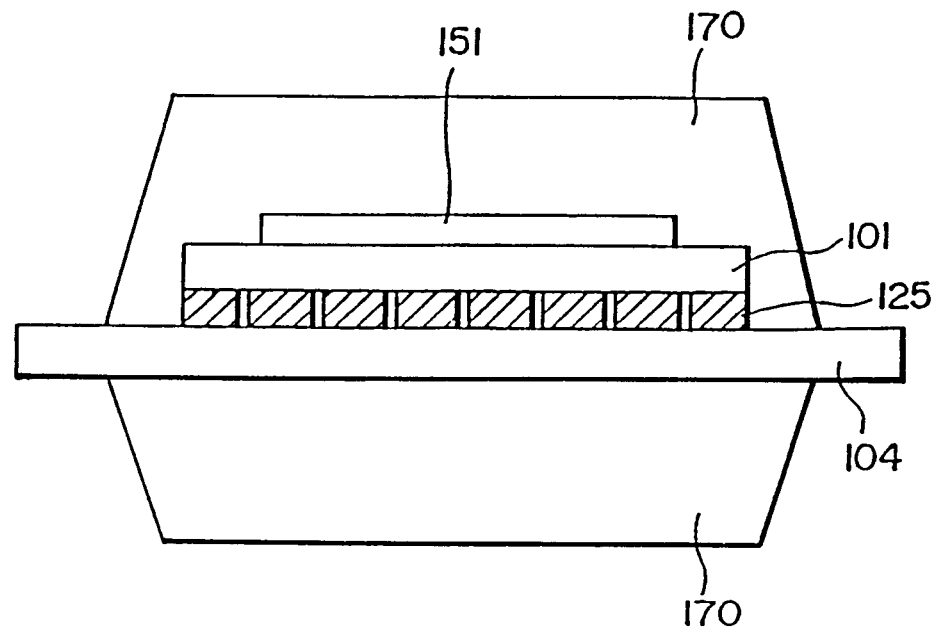
Figures 4, 5C:
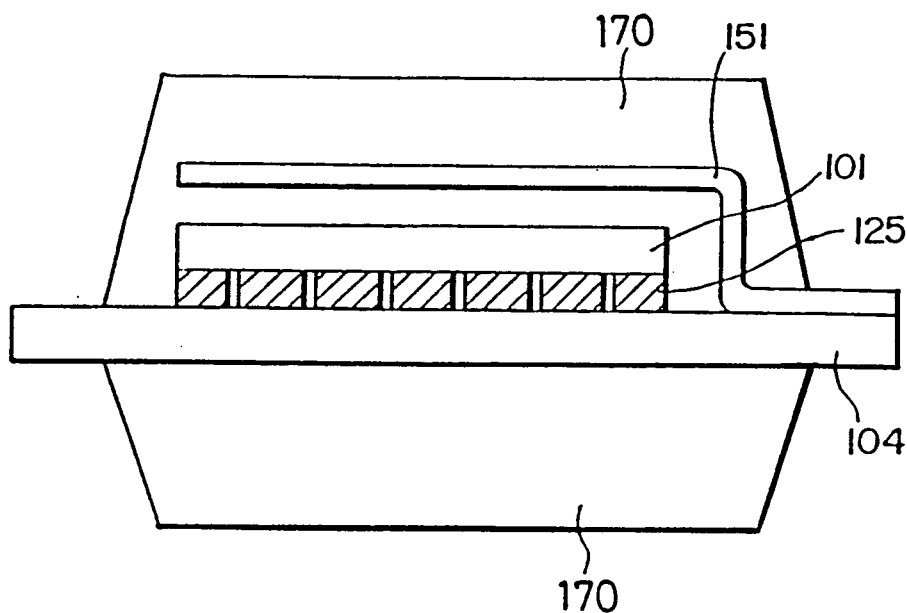

Then, the electrical circuit thus formed is sealed so that a sealed electrical circuit device is obtained as shown in FIG. 5(c)-1. More specifically, in this Example, both the semiconductor device 101 and the circuit board 104 are sealed. The sealing is conducted by injection molding, using a thermoplastic resin as the sealing material.

The thus obtained electrical circuit device was subjected to a test for examining the quality of the bonds and showed high reliability at each bond. The electrical circuit device also showed superior characteristics in other respects.

EXAMPLE 1-D2

Figure 2:
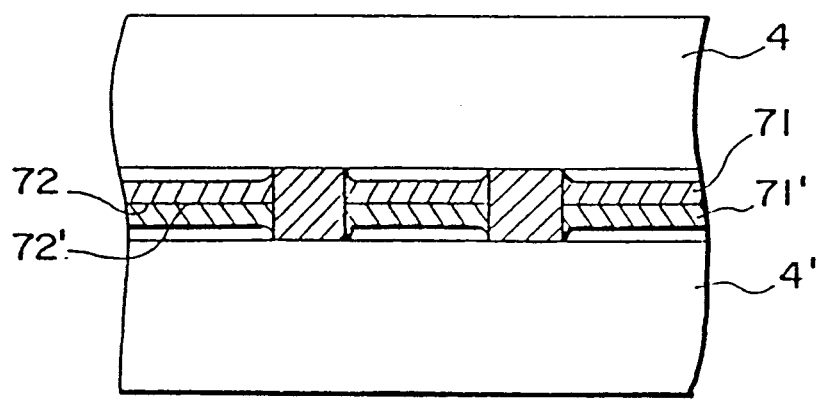

FIG. 5(c)-2 shows Example 1-D2. In this Example, a plate 151 of a stainless steel, 0.1 mm in thickness, was attached by adhesion to the sealing material 170 sealing the semiconductor device 101. Other portions are materially the same as those of Example 1-D1.

EXAMPLE 1-D3

Figure 3:
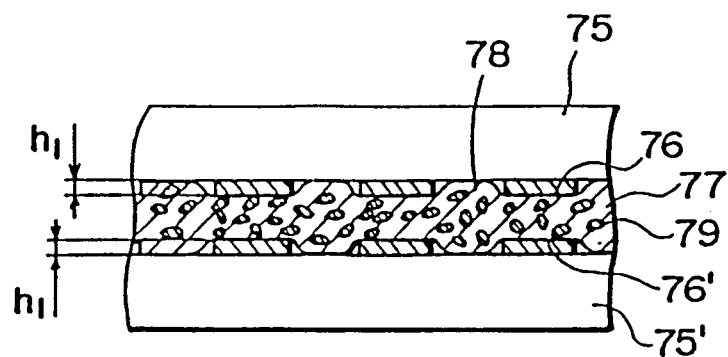

FIG. 5(c)-3 show Example 1-D3. In this embodiment, a stainless steel late 151 of 0.1 mm thick was secured by adhesion to the surface of the semiconductor device 101 opposite to the electrical connecting member 125 arranged in the same manner a Example 1-D1. Other portions are materially the same as Example 1-D1.

EXAMPLE 1-D4

Figure 4:
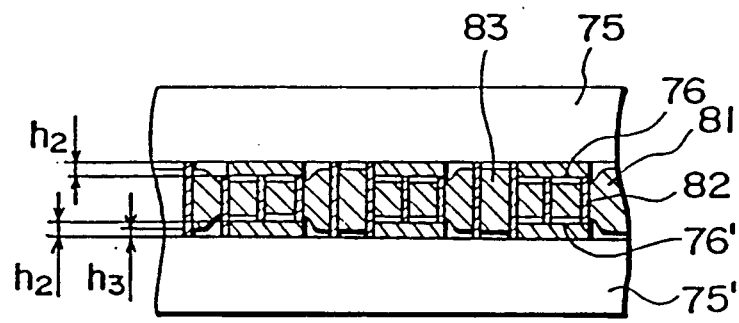

FIG. 5(c)-4 shows Example 1-D4. In this Example, a stainless steel plate 151 of 0.1 mm thick is disposed in the vicinity of the semiconductor device 101 arranged in the same manner as Example 1-D1. Other portions are materially the same as those of Example 1-D1.

EXAMPLE 1-E1

Figures 5, 5C:
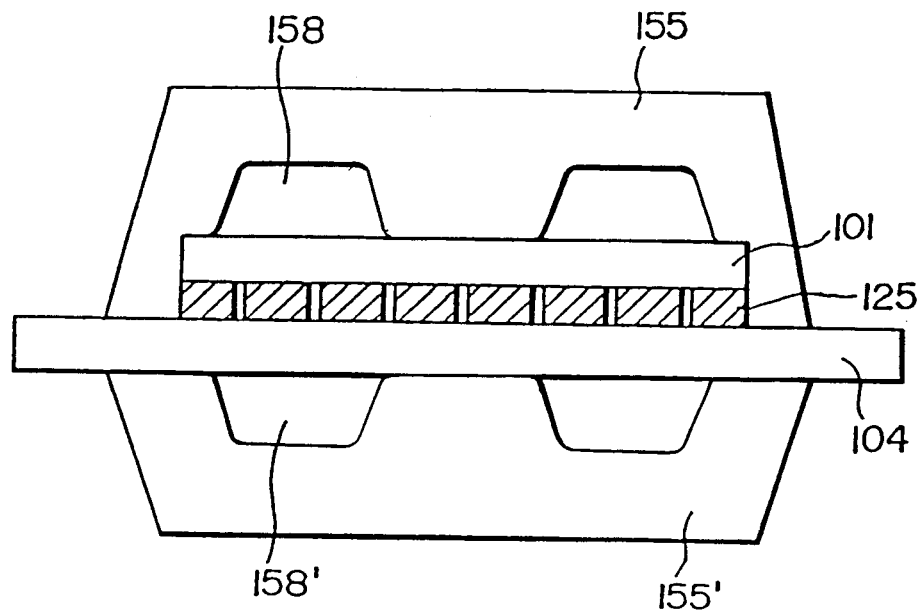

FIG. 5(c)-5 shows Example 1-E1. This example is basically the same as Example 1-D1 except that both the semiconductor device 101 and the circuit board 104 are sealed with caps.

As shown in this Figure, each of the caps 155 and 155' is provided with a pair of hollows therein. The hollows provide cavities 158, 158' with the projected inner surfaces abutting the surfaces of the semiconductor device 101 and the circuit board 104 opposite to the electrical connecting member 125 so that the semiconductor device 101 and the circuit board 104 are securely held on the electrical connecting member 125.

In this Example, caps 155 and 155' are adhered to each other by an adhesive.

Other portions are materially the same as those of Example 1-D1.

EXAMPLE 1-E2

Figures 5, 5C, 6:
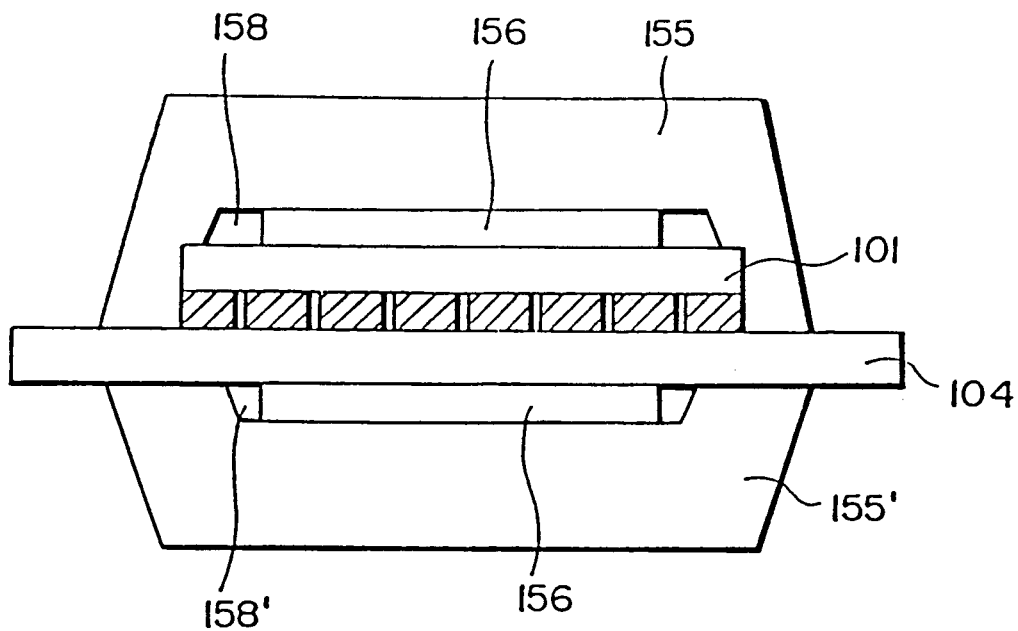

FIG. 5(c)-6 shows Example 1-E2. This Example is substantially the same as Example 1-E1 except that caps 155 and 155' have adjusting members 156 placed between these caps and the semiconductor device 101 and the circuit board 104. Other portions are materially the same as those in Example 1-E1.

EXAMPLE 2-D1

Figure 7A:
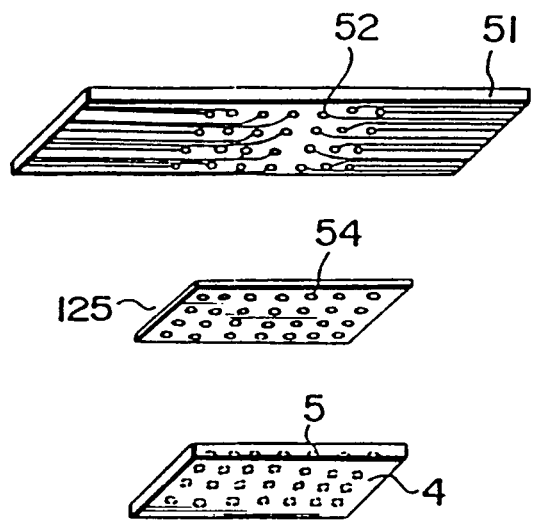
Figures 1, 7B:
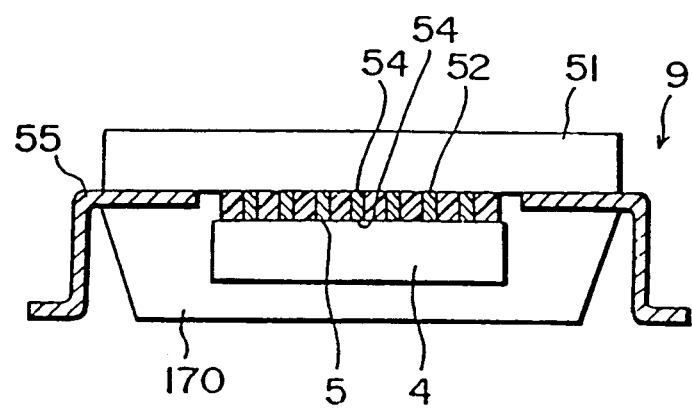
Figures 2, 7B:
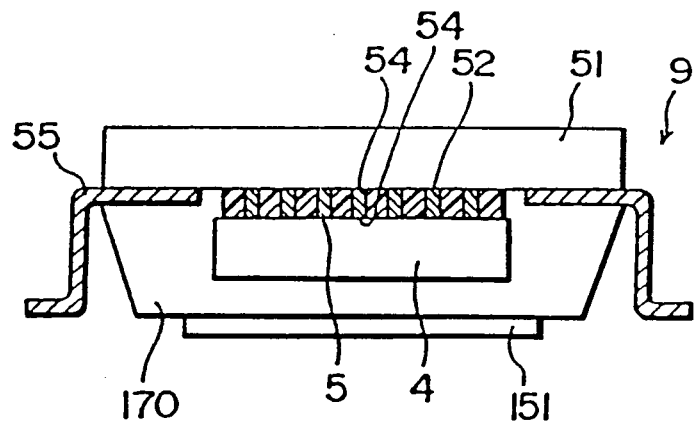
Figures 3, 7B:
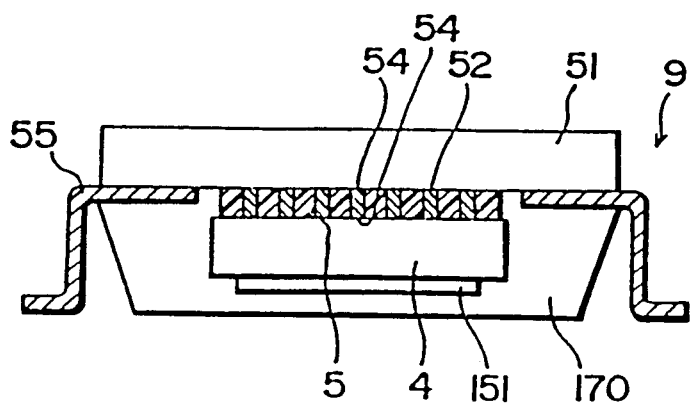
Figures 4, 7B:
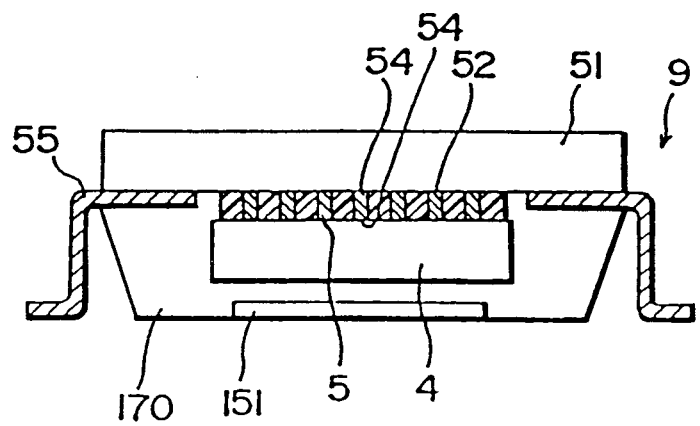
Figures 5, 7B:
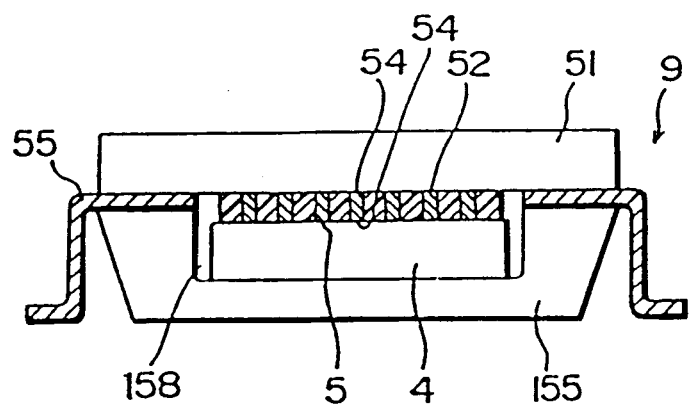
Figures 6, 7B:
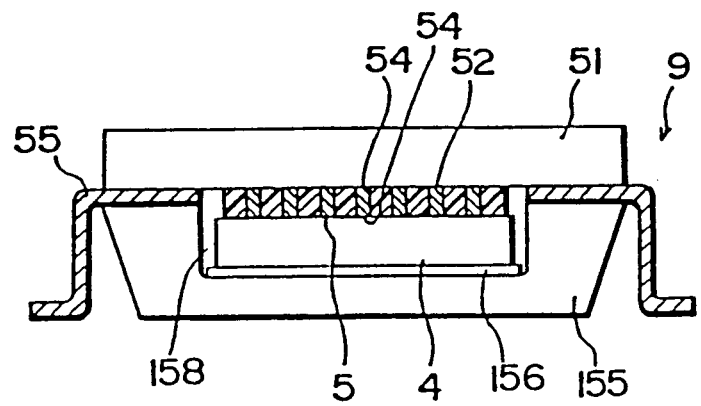

FIGS. 7(a) and 7(b)-1 show Example 2-D1.

In this Example, a circuit board 51 having connecting portions 52 was used as a first electrical circuit component, while a semiconductor device 4 having a multiplicity of internal connecting portions 5 was used as the second electrical circuit component.

The electrical connecting member 125 used in this Example had a holding body made of an organic material in which dispersed were powder particles (not shown) of $SiO_2$.

In this Example, the connecting portions 54 of the electrical connecting member and the connecting portions 52 of the circuit board 51 are bonded by metallizing and/or alloying effected by supersonic heating, while the connecting between the electrical circuit component 125 and the semiconductor device 4 is executed by a method other than metallizing and/or alloying. Namely, the semiconductor device 4 is pressed onto the electrical connecting member 125 and temporarily held thereon and then the semiconductor device 4 is sealed.

The electrical connecting member 125 used in this Example had a size corresponding to that of the semiconductor device 4.

In this Example, a lead frame 55 is connected to the underside of the circuit board 51.

It is also to be noted that only the semiconductor device 4 is sealed in this Example. A material composed of a thermoplastic resin with powdered $SiO_2$ dispersed therein was used as the sealing material.

Other portions are materially the same as those of Example 1-D1.

It was confirmed that the connection was attained with a high degree of reliability. The electrical circuit device thus formed also showed superior characteristics also in other respects.

EXAMPLE 2-D2

FIG. 7(b)-2 shows Example 2-D2. This Example is basically the same as Example 2-D1 except that a stainless steel plate 151 of 0.1 mm thick is secured by adhesion to the surface of the sealing material 170 sealing one of the electrical circuit components. Other portions are materially the same as those of Example 2-D1.

EXAMPLE 2-D3

FIG. 7(b)-3 shows Example 2-D2.

This Example is basically the same as Example 2-D1 except that a stainless steel plate 151 of 0.1 mm thick is secured by adhesion to the surface of the semiconductor device 4 opposite to the electrical connecting member 125. Other portions are materially the same as those of Example 2-D1.

EXAMPLE 2-D4

FIG. 7(b)-4 shows Example 2-D4. This Example is basically the same as Example 2-D1 except that a stainless steel plate 151 of 0.1 mm thick is disposed in the vicinity of the semiconductor device 4. In this Example, sealing is accomplished by allowing only one side of the plate 151 to be exposed.

Other portions are materially the same as those of Example 1-D1.

EXAMPLE 2-E1

FIG. 7(b)-5 shows Example 2-E1. This Example is basically the same as Example 2-D1 except that the semiconductor device 4 is sealed with a cap 155.

As shown in FIG. 7(b)-5, the cap 155 used in this Example has only one recess. The cap is shaped and sized such that cavities 158 are left on both sides of the semiconductor device 4 when the latter is capped. In this Example, only the semiconductor device 4 is sealed by the cap 155. Other portions are materially the same as those of Example 2-D1.

EXAMPLE 2-E2

FIG. 7(b)-6 shows Example 2-E2. This Example is basically the same as Example 1-E1 except that an adjusting member 156 is placed between the semiconductor device 4 and the cap 155. Other portions are materially the same as those of Example 1-E1.

EXAMPLE 3-D1

Figures 1, 8A:
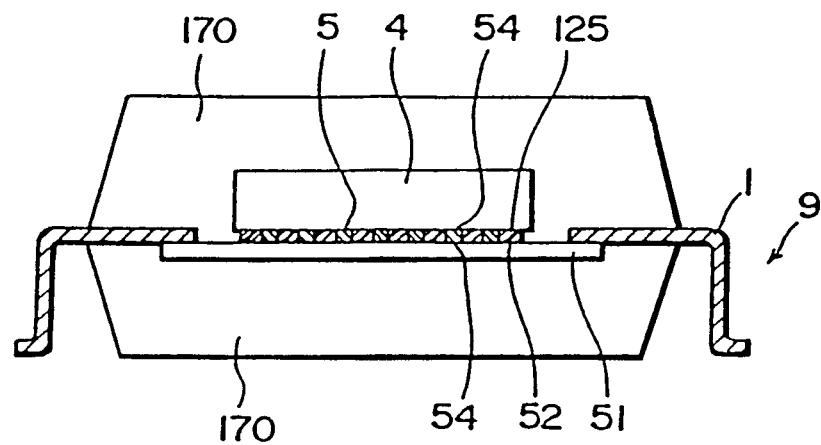
Figures 2, 8A:
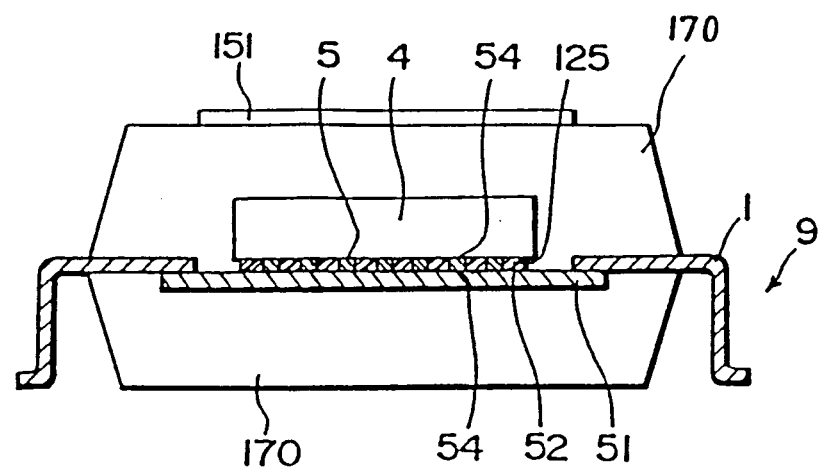
Figures 3, 8A:
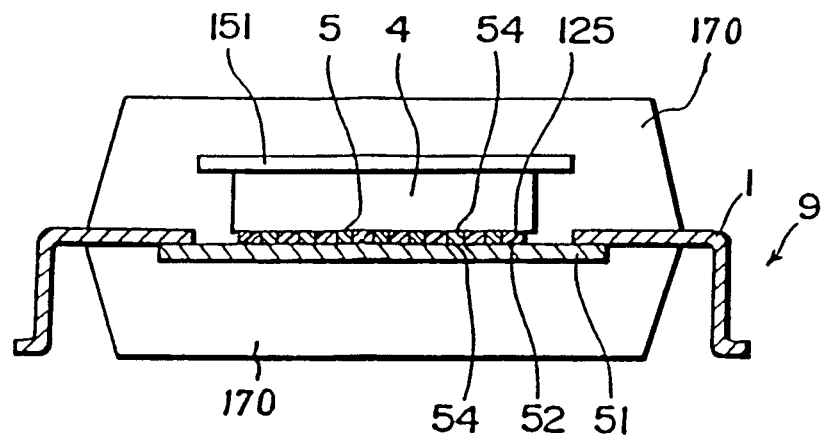
Figures 4, 8A:
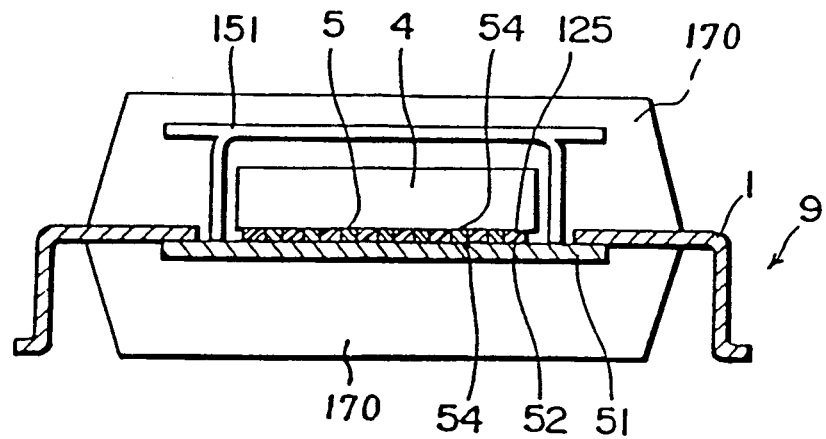
Figures 5, 8A:
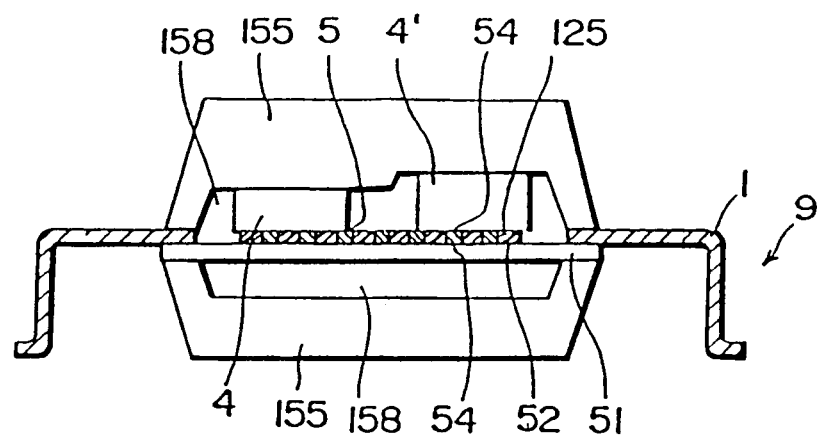
Figures 6, 8A:
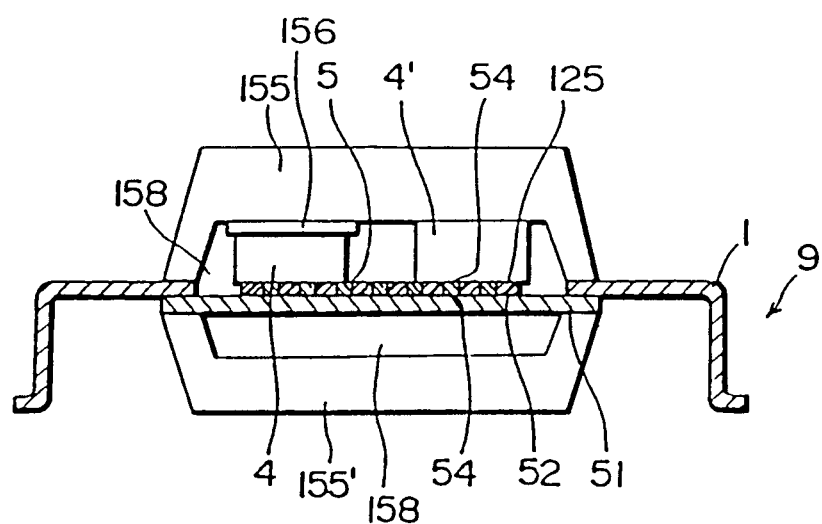
Figures 1, 8B:
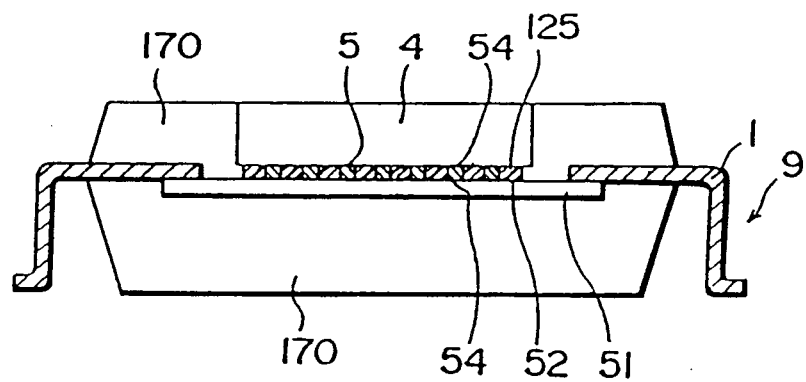
Figures 2, 8B:
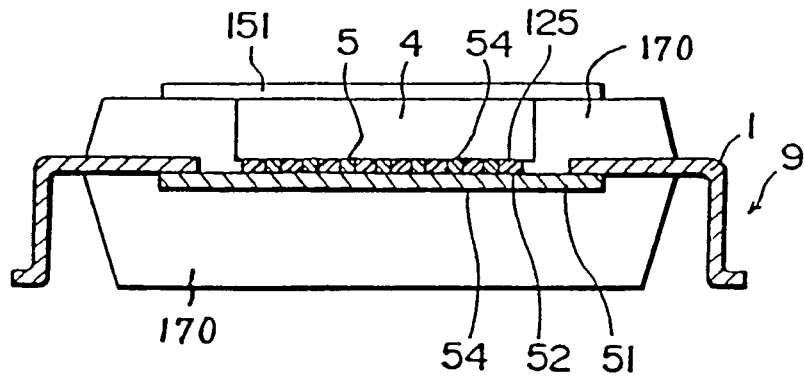
Figures 3, 8B:
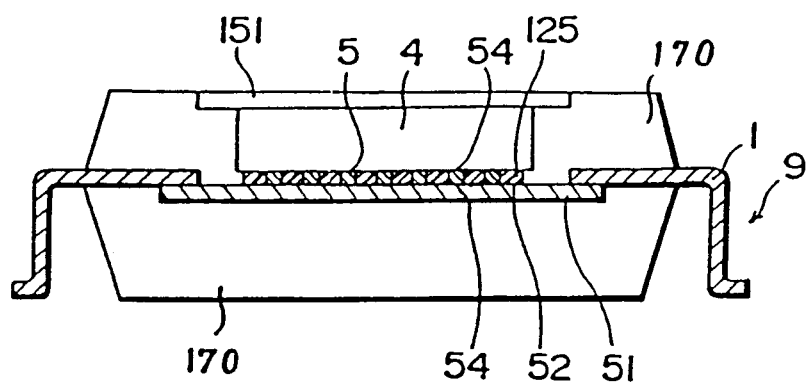
Figures 4, 8B:
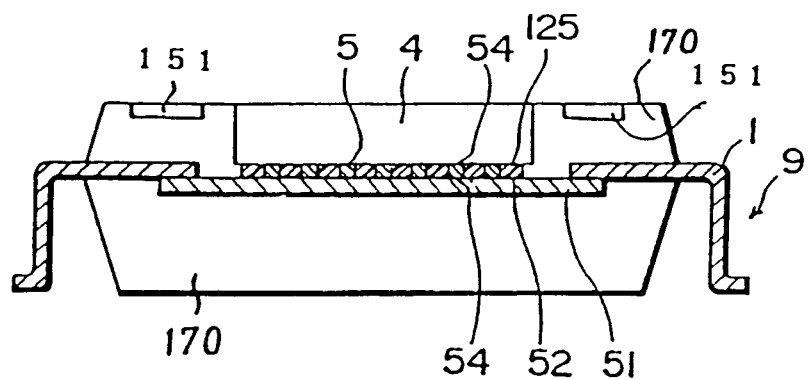
Figures 5, 8B:
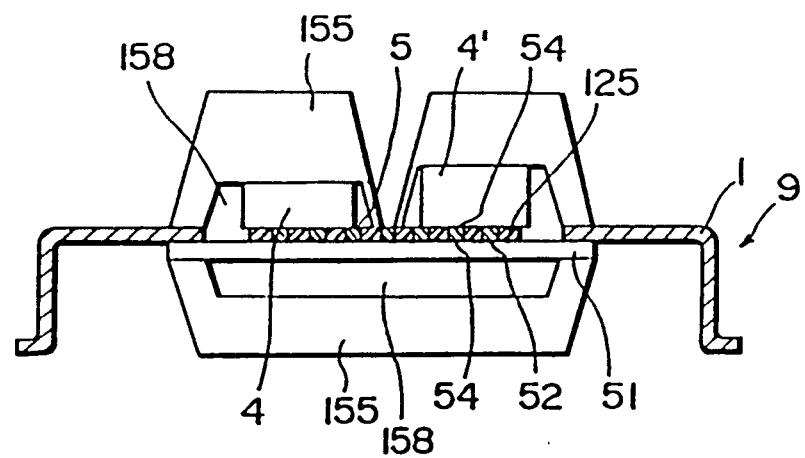

FIG. 8(a)-1 and 8(b)-1 show Example 3-D1.

In this Example, a semiconductor device 4 and a circuit board 51 are used as first and second electrical circuit components, respectively.

After the connecting, a lead frame 1 is connected to the upper side of the circuit board 51 and the thus formed electrical circuit device is placed in a mold cavity. Then, a sealing material 170 is injected to seal the electrical circuit device. A thermoplastic resin containing powder of $Si)_2$ dispersed therein is used as the sealing material 170.

FIG. 8(a) shows a modification in which the semiconductor device 4 is wholly sealed with the sealing material, while FIG. 8(b) shows a case where the semiconductor device 4 is sealed only at its side surfaces with the upper surface thereof exposed to the outside.

Other portions are materially the same as those of Example 1-D1.

A high reliability of electrical connection was confirmed also in this case. The electrical circuit device showed superior characteristics also in other respects.

EXAMPLE 3-D2

FIG. 8(a)-2 shows Example 3-D2. This Example is basically the same as Example 3-D1 except that a stainless steel plate 151 of 0.1 mm thick is adhered to the surface of the sealing material 170 sealing one of the electrical circuit components.

Other portions are materially the same as those of Example 3-D1.

FIG. 8(b)-2 shows a modification of Example 3-D2. This modification is similar to the modification of Example 3-D1, except that the sheet 151 is adhered to the surface of the sealing material 170 and the exposed surface of the semiconductor device 4.

Other portions are materially the same as those of the modification of Example 3-D1.

EXAMPLE 3-D3

FIG. 8(a)-3 show Example 3-D3.

In this Example, a stainless steel sheet 151 of 0.1 mm thick is adhered to the surface of the semiconductor device 4 opposite to the electrical connecting member 125. Other portions are materially the same as those of Example 3-D1.

FIG. 8(b)-3 shows a modification of Example 3-D3.

This modification is similar to the modification of Example 3-D1, except that the sheet 151 is adhered to the exposed surface of the semiconductor device 4. The surface of the sheet 151 opposite to the semiconductor device is exposed to the outside.

Other portions are materially the same as those of the modification of Example 3-D1.

EXAMPLE 3-D4

FIG. 8(a)-4 shows Example 3-D4. This Example is similar to Example 3-D1 except that a composite member 151, 0.1 mm thick, of a stainless steel, is positioned in the vicinity of the semiconductor device 4. The composite member 151 is disposed in such a manner as to surround the semiconductor device 4.

Other portions are materially the same as Example 3-D1.

FIG. 8(b)-4 shows a modification of Example 3-D4. This modification is similar to the modification of Example 3-D1 except that the plate 151 is placed on each side of the semiconductor device 4. Each plate 151 is exposed at its one side. Other portions are materially the same as those of the modification of Example 3-D1.

EXAMPLE 3-E1

FIG. 8(a)-5 shows Example 3-E1. This Example is similar to Example 3-D1 but employs a pair of semiconductor devices 4, 4' of different heights. These semiconductor devices 4, 4' are sealed with a cap.

The cap has, as shown in FIG. 7(b)-5, a recess with a height step. The cap 155 is so shaped and sized that hollows or cavities 158 are formed on opposite sides of the semiconductor devices 4, 4'.

Other portions are materially the same as those of Example 3-D1.

FIG. 8(b)-5 shows a modification of Example 3-E1. This modification is discriminated from Example 3-E1 in that the semiconductor devices 155 are capped with different caps 4 and 4'. Other portions are materially the same as those of this Example.

EXAMPLE 3-E2

FIG. 8(a)-6 shows Example 3-E2. This Example is basically the same as Example 3-E1 except that an adjusting member 156 is placed between the semiconductor device 4 and the cap 155 with which the semiconductor device 4 is sealed. Other portions are materially the same as Example 3-E1.

EXAMPLE 4-D1

Figures 1, 9A:
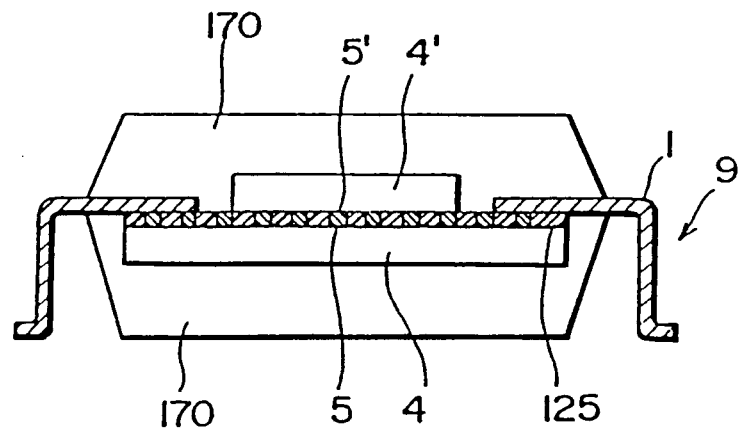
Figures 2, 9A:
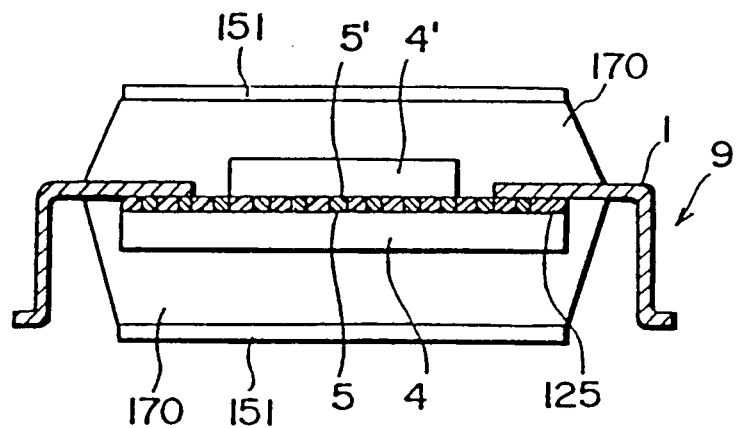
Figures 3, 9A:
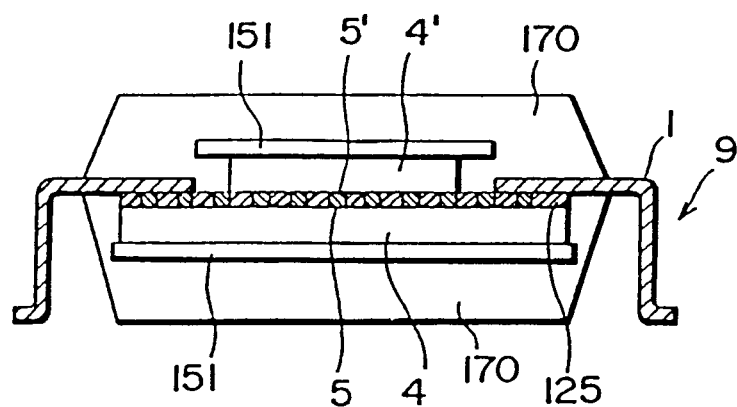
Figures 4, 9A:
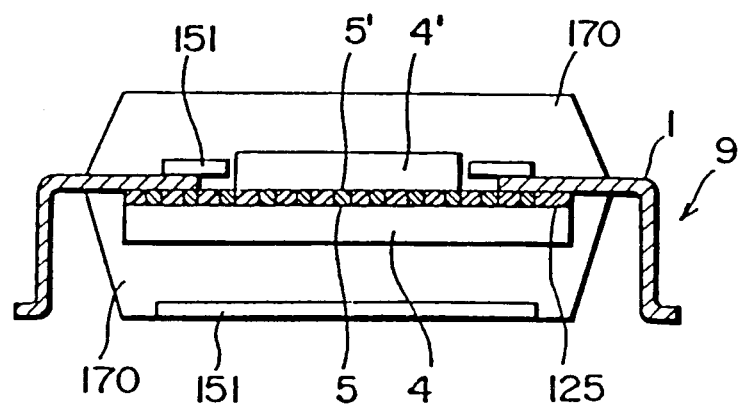
Figures 5, 9A:
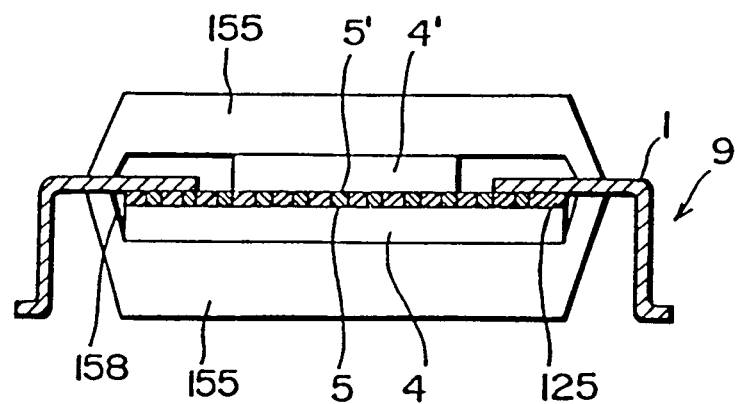
Figures 6, 9A:
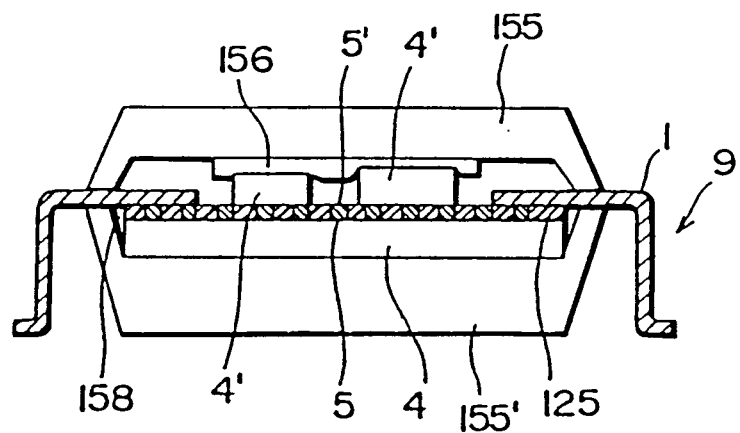
Figures 1, 9B:
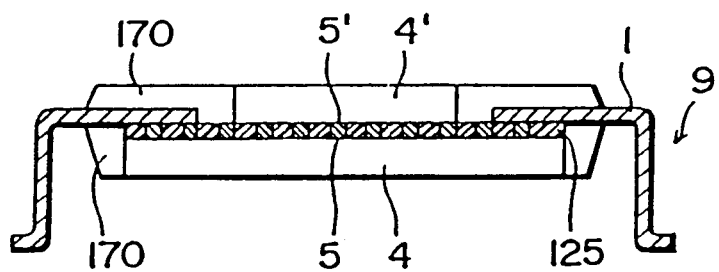
Figures 2, 9B:
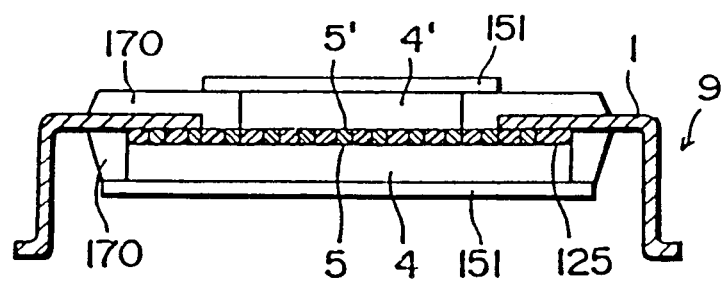
Figures 3, 9B:
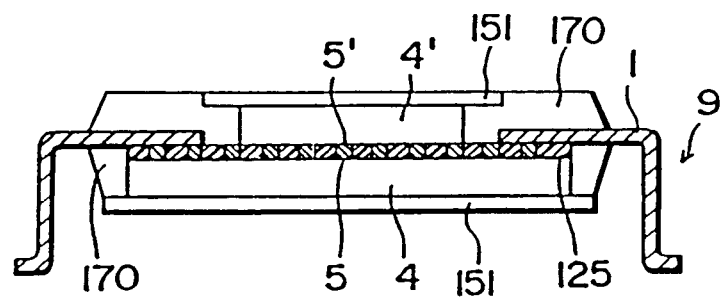
Figures 4, 9B:
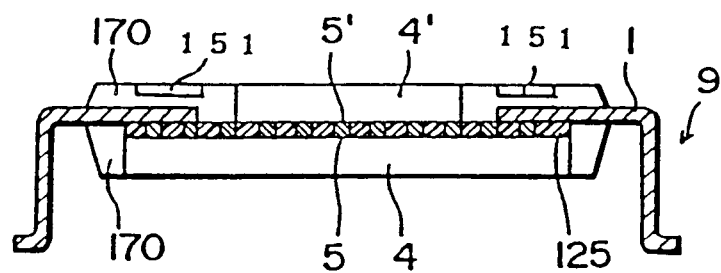

FIG. 9(a)-1 shows Example 4-D1. In this Example, semiconductor devices 4' and 4 were used as first and second electrical circuit components. The electrical connecting member 125 used in this Example has a size corresponding to the semiconductor device 4. In addition, a lead frame 1 is connected to metallic members which are exposed on the side of the electrical connecting member 125 adjacent to the first semiconductor device 4'. An organic material with dispersion of either one of powders or fibers of a metal is used as the insulation member of the electrical connecting member 125. In FIG. 9(a)-1, both the semiconductor devices 4 and 4' are bonded to the electrical connecting member by metallizing and/or alloying effected by supersonic heating. In FIG. 9(b)-1, only one of the semiconductor devices is bonded through metallizing and/or alloying. When sealing is effected, the semiconductor devices 4, 4' are suitably pressed, although not shown.

In the electrical circuit device shown in FIG. 9(a)-1, both the semiconductor devices 4, 4' on the upper side are wholly sealed with a sealing material, whereas, in FIG. 9(b)-1, the semiconductor devices 4, 4' are sealed only at their side surfaces, with their upper surfaces exposed to the outside.

Other portions are materially the same as those of Example 3-D1.

High reliability of connecting was confirmed also in this Example. This Example exhibited superior characteristics in various other respects.

EXAMPLE 4-D2

FIG. 9(a)-2 shows Example 4-D2. In this Example, stainless steel plates 151 of 0.1 mm thick are adhered to the surfaces of the sealing material 170 sealing both semiconductor devices arranged in the same manner as Example 4-D1. Other portions are materially the same as those of Example 4-D1.

FIG. 9(b)-2 shows a modification of Example 4-D2. This modification is similar to the modification of Example 4-D1 but a single plate 151 is adhered to the surface of the sealing member 170 and the exposed surface of the semiconductor device 4'. Similarly, another plate 151 is adhered to the exposed surface of the semiconductor device 4 and the sealing material 170 with which the semiconductor device 4 is sealed.

Other portions are materially the same as those of the modification of Example 4-D1.

EXAMPLE 4-D3

FIG. 9(a)-3 shows Example 4-D3.

This Example is similar to Example 4-D1 but a stainless steel plate 151 of 0.1 mm thick is adhered to the surface of the semiconductor device 4 opposite to the electrical connecting member 125. Similarly, a stainless steel plate 151 of 0.1 mm thick is adhered to the surface of the semiconductor device 4' opposite to the electrical connecting member 125. Other portions are materially the same as those of Example 4-D1.

FIG. 9(b)-3 shows a modification of Example 4-D3. This modification is similar to the modification of Example 4-D1, but plates 151 are adhered to the exposed surfaces of the semiconductor devices 4, 4'. The surfaces 4, 4' of the plates 151 opposite to the respective semiconductor devices 4, 4' are exposed to the outside. Other portions are materially the same as Example 4-D1.

EXAMPLE 4-D4

FIG. 9(a)-4 shows Example 4-D4. This Example is similar to Example 4-D1 but stainless steel plates 151 of 0.1 mm thick were placed in the vicinity of both side surfaces of the semiconductor device 4'. In addition, a plate 151 is disposed in the vicinity of the semiconductor device 4. This plate 151 is exposed at its one side.

FIG. 9(b)-4 shows a modification of Example 4-D4. This modification is similar to the modification of Example 4-D1 but plates 151 are placed in the vicinity of both side surfaces of the semiconductor device 4'. These plates are exposed at their one sides. Other portion are materially the same as the modification of Example 4-D1.

EXAMPLE 4-E1

FIG. 9(a)-5 shows Example 4-E1. This Example is similar to Example 4-D1 except that the semiconductor devices 4, 4' are sealed with respective caps. Other portions are materially the same as Example 4-D1.

EXAMPLE 4-E2

FIG. 9(a)-6 shows Example 4-E2. In this Example, semiconductor devices 4, 4' of different heights are sealed with a cap 155 with the intermediary of an adjusting member 156 having a height step. Other portions are materially the same as those of Example 4-E1.

EXAMPLE 5

Figure 10A:
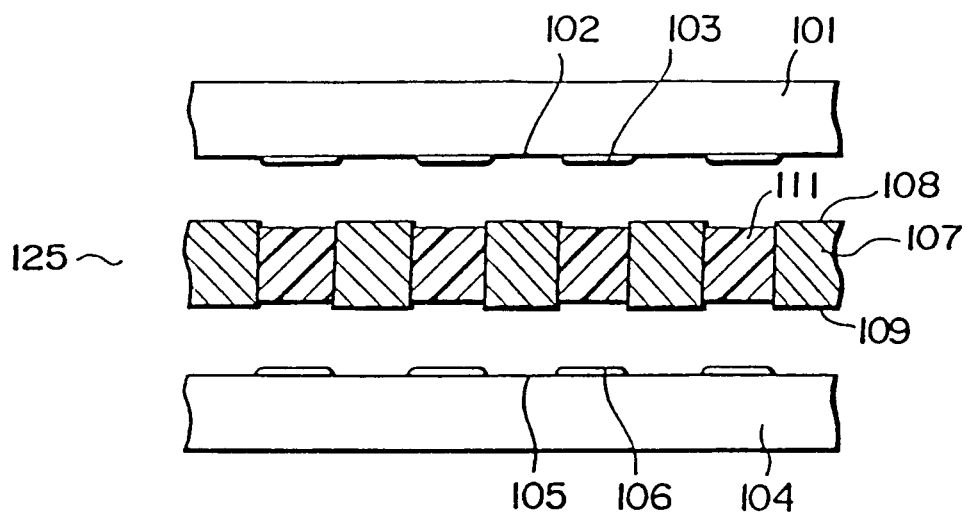
FIG. 10(a) and 10(b) are sectional views of an embodiment 5 in the state before and after the connection.
Figure 10B:
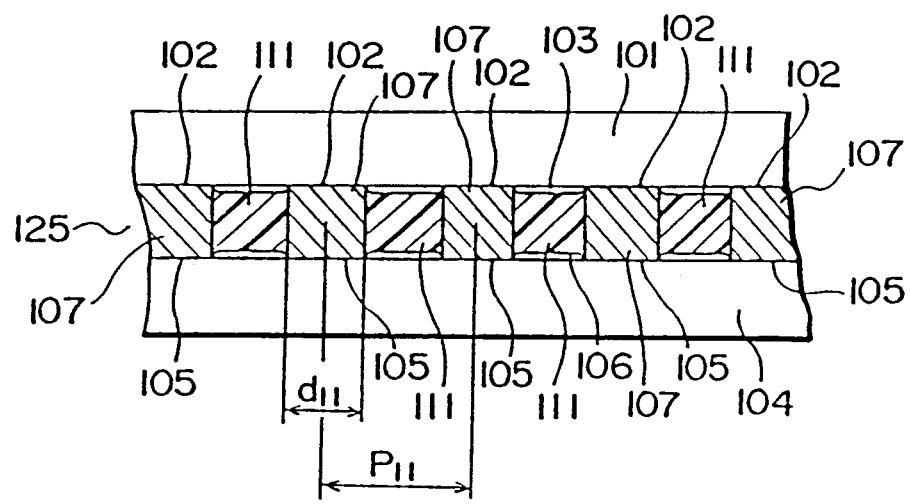
Figure 11A:
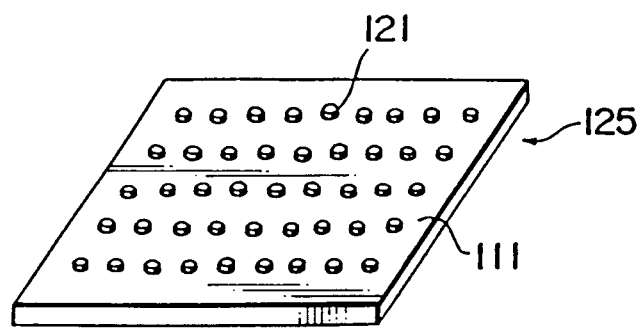
Figure 11B:
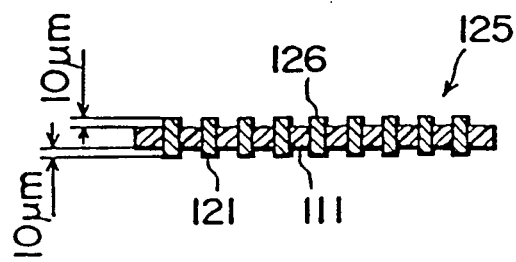

FIG. 10 shows Example 5. In this Example, circuit boards 101 and 104 are sealed at portions thereof other than the connecting portions were are used as first and second electrical circuit components. FIG. 11 shows an electrical connecting member 125 used in Example 5. As will be seen from this Figure, the exposed portions of the metallic members are projected from the surface of the holding body (resin insulating member) 111. This electrical connecting member 125 can be prepared, for example, by the following method.

Figure 6B:
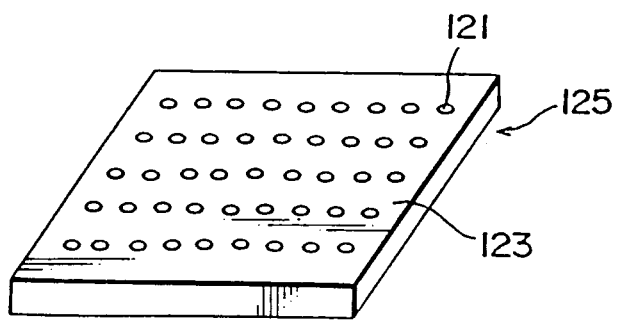
Figure 6C:
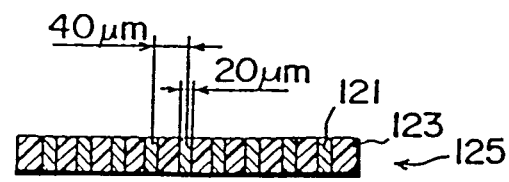

An electrical connecting member is prepared perform of an electrical connecting member of the type shown in FIGS. 6(b) and 6(c) is prepared by the method described in connection with Example 1-D1. Then, both surfaces of the preform are etched until the electrical wire 121 projects from the polyimide resin by an amount of 10 μm or so. This amount of projection, however, is not exclusive and the amount may be determined freely. It is also possible to use various chemical and/or mechanical processes, though etching has been specifically mentioned.

Other portions are materially the same as those of Example 1-D1.

It is possible to form bumps 150 as shown in FIG. 8. Such bumps can be formed by preparing dies having recesses at positions corresponding to the metal wires 121 of the electrical connecting member 125, and pressing the electrical connecting member 125 between these dies so as to collapse the projections 126. Such bumps 150 suppresses any risk for the metallic wires 121 to come off the insulating member 111.

It is to be understood that the metallic wires 121 provide the metallic members 107 while the resin 123 provides the insulating member 111 also in this embodiment.

The formation of the bumps can be conducted in various other methods such as melting of the exposed metallic members by applying heat thereto.

A high reliability of bonds was confirmed also in this Example. This Example showed superior characteristics even in other respects.

EXAMPLE 6-D1

Figure 13A:
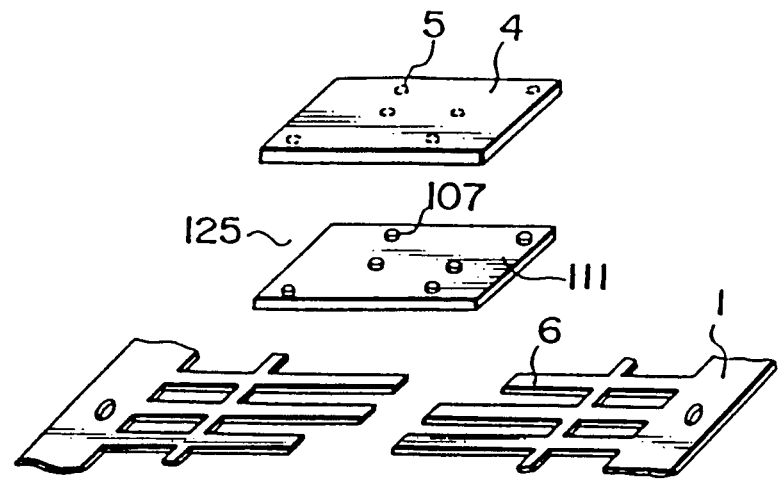
Figures 1, 13B:
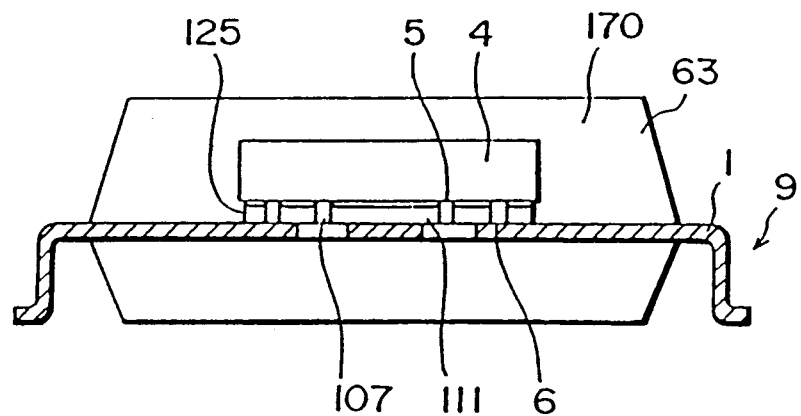
Figures 2, 13B:
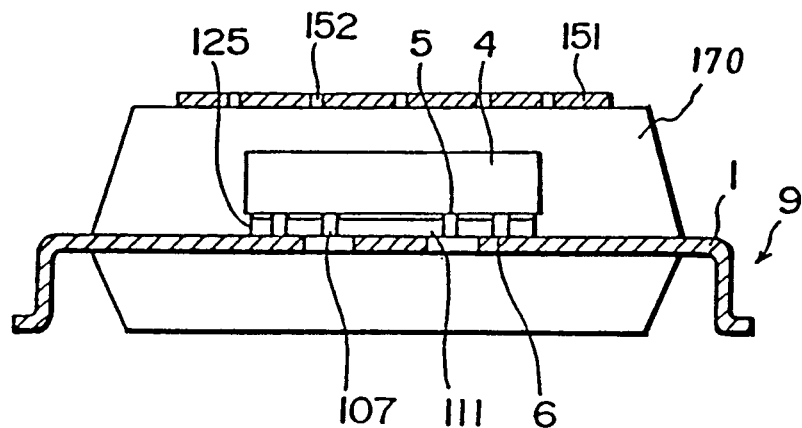
Figures 3, 13B:
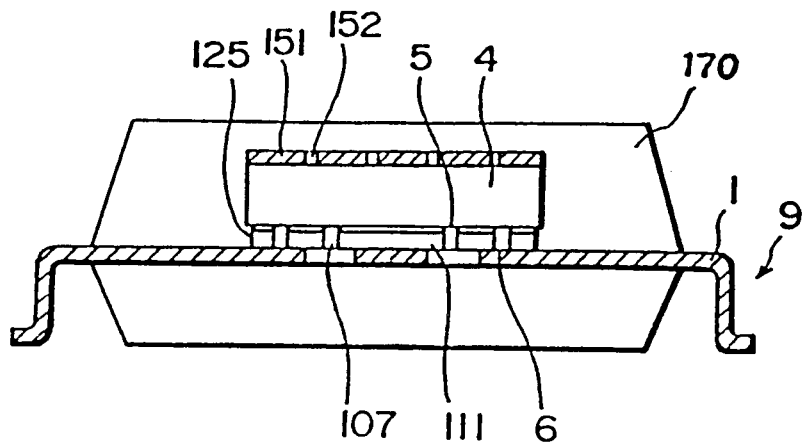
Figures 4, 13B:
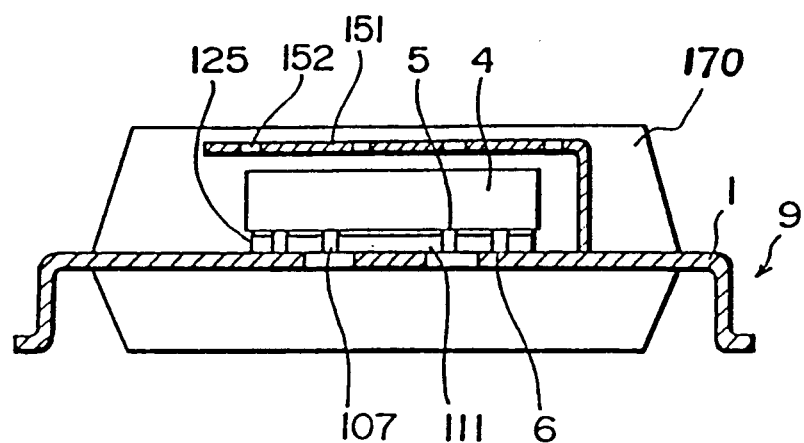
Figures 5, 13B:
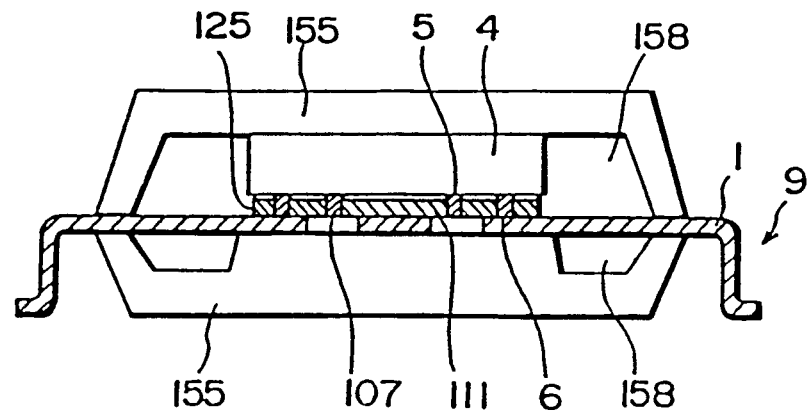
Figures 6, 13B:
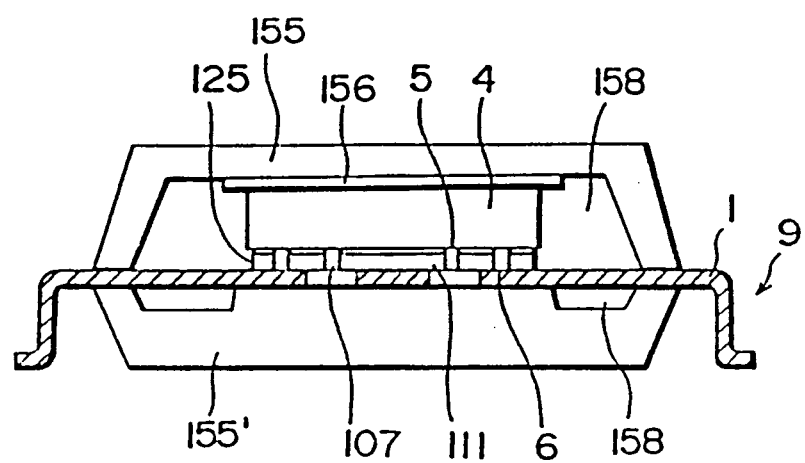

FIGS. 13(a) and 13(b)-1 show Example 6-D1.

In this Example, a semiconductor device 4 is used as the first electrical circuit component, while a lead frame 1 is used as the second electrical part.

The lead frame 1 had connecting portions 6 composed of a 42 alloy plated with Ag. The connecting is effected by heat-press connecting method simultaneously employing supersonic heating and external heating. Other portions are materially the same as those of Example 5. High reliability of bond was confirmed also in this case. In addition, this Example showed superior characteristics also in various other respects.

EXAMPLE 6-D2

FIG. 13(b)-2 shows Example 6-D2. This Example is similar to Example 6-D1 but a stainless steel plate 151 of 0.1 mm thick and having apertures 152 is adhered to the sealing material 170 sealing the semiconductor device 4. Other portions are materially the same as those of Example 6-D1.

EXAMPLE 6-D3

FIG. 13(b)-3 shows Example 6-D3. This Example is similar to Example 6-D1 but a stainless steel sheet 151 of 0.1 mm thick and having apertures 152 is adhered to the surface of the semiconductor device 4 opposite to the electrical connecting member 125. Other portions are materially the same as those of Example 6-D1.

EXAMPLE 6-D4

FIG. 13(b)-4 shows Example 6-D4. This Example is similar to Example 6-D1 except that a stainless steel plate 151 having a thickness of 0.1 mm and substantially bent at a right angle is disposed in the vicinity of the semiconductor device 4. Other portions are materially the same as those of Example 6-D1.

EXAMPLE 6-E1

FIG. 13(b)-5 shows Example 6-E1.

In this Example, both the semiconductor device 4 and the lead frame 1 are sealed with respective caps. Other portions are materially the same as those of Example 6-D1.

EXAMPLE 6-E2

FIG. 13(b)-6 shows Example 6-E2. In this Example, the semiconductor device 4 is sealed with a cap 155 with an adjusting member 156 interposed therebetween. Other portions are materially the same as those of Example 6-E1.

EXAMPLE 7

Figure 14A:
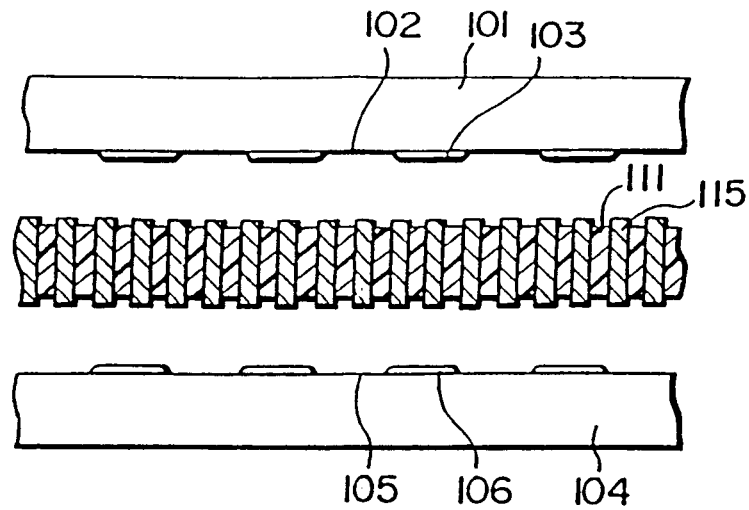
FIGS. 14(a) and 14(b) are sectional views of an embodiment 7 in the states before and after the connection.
Figure 14B:
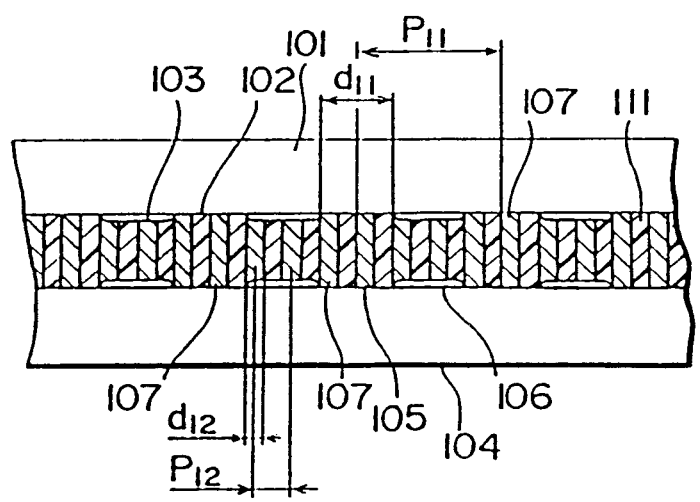

FIGS. 14(a) and 14(b) show Example 7. Example 7 employed an electrical connecting member 125 different from that used in Example 5.

More specifically, the electrical connecting member 125 used Example 7 has metallic members arranged in a pitch smaller than that in the electrical connecting member 125 used in Example 5. That is, the pitch of the metallic members 107 is smaller than that of the connecting portions of the first circuit board. In Example 5 described before, connecting portions of the electrical connecting member 125 are placed in alignment with the connecting portions of the first and second circuit boards 101 and 104, so that it is necessary to precisely position the connecting member 125. In Example 7, however, the first and second circuit boards 101 and 104 need not be precisely located with respect to the electrical connecting member 125, through they have to be located with respect to each other. Therefore, by suitably selecting the sizes of connecting ($d_{11}$, $P_{11}$) of the first and second circuit boards 101 and 104 and the sizes of connecting ($d_{12}$, $P_{12}$) of the electrical connecting member, it is possible to electrically connect the first and second circuit boards 101 and 104 without requiring the electrical connecting member 125 to be positioned. The electrical connecting member 125 has electrically conductive members which project from both sides of the member 125 as at 126.

Other portions are materially the same as those in Example 1-D1. A high reliability of bond was confirmed also in this Example. This Example showed superior characteristics also in various other respects.

EXAMPLE 8

Figure 15A:
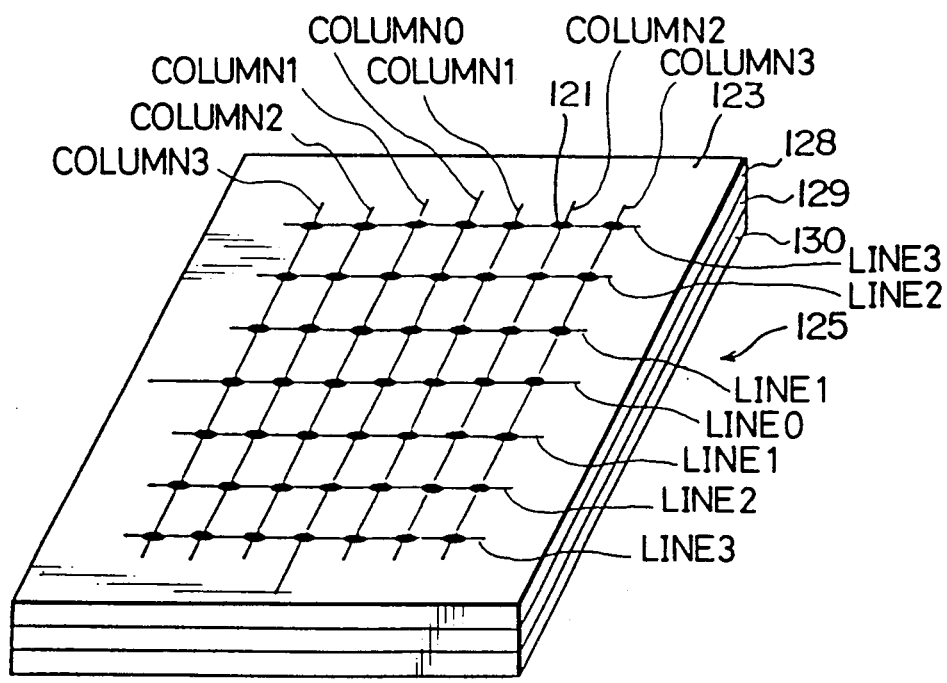
FIGS. 15(a) and 15(b) are a perspective view and a sectional view of an electrical connecting member used in embodiment 8.
Figure 15B:
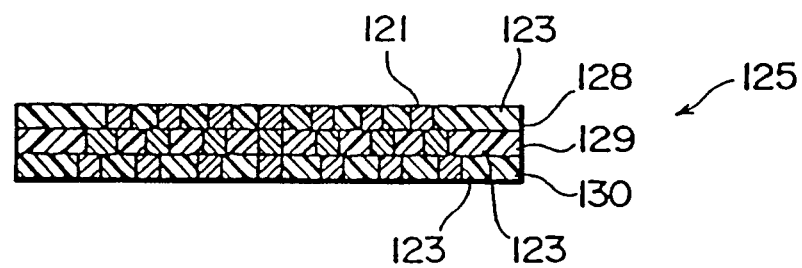

FIGS. 15(a) and 15(b) shows an electrical connecting member used in Example 8, in a perspective view and in a sectional view, respectively.

The electrical connecting member shown in FIGS. 15(a) and 15(b) could be prepared, for example, by the following process.

Three elements of the electrical connecting member, denoted by 128, 129 and 130, are prepared through the process explained before in connection with Example 1-D1.

In the first element 128, the fractions of the metallic wire 121, i.e., the metallic members, are arranged such that the metallic member 121 of the m-th line and n-th column is offset by ma and nb from the center of the first element. In the second element 129, the fractions of the metallic wire 121, i.e., the metallic members, are arranged such that the metallic member 121 of the m-th line and n-th column is offset by mac and nbc from the center of the second element. In the third element 130, the fractions of the metallic wire 121, i.e., the metallic members, are arranged such that the metallic member 121 of the m-th line and n-th column is offset by mad and nbd from the center of the third element. The values a, b, c and d are determined such that each metallic member 121 electrically contacts the metallic member or members 121 of the adjacent element or elements vertically overlapping each other but do not contact with other metallic members. After locating these three elements, supersonic heating is effected to bond these elements, whereby the electrical connecting member 125 is formed.

In this Example, the metallic members of each element of the electrical connecting member are arranged in the form of a matrix having m lines and n columns. This, however, is not essential and the metallic members may be arranged in a random manner provided that only the vertically lapping metallic members can electrically contact each other.

Figure 12A:
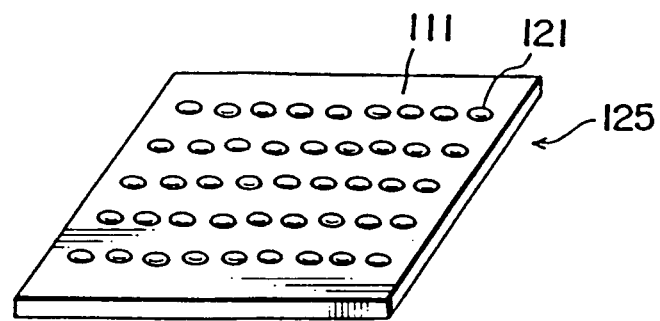
Figure 12B:
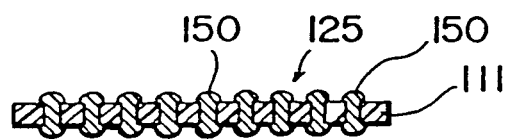

The number of the elements, which is three in this Example, may be two or four or more. The connecting of these elements may be effected by press-connecting, adhesion or the like method, although supersonic heating method was mentioned. The electrical connecting member 125 thus formed may be processed such that the metallic members project as shown in FIG. 11. The projected ends of the metallic members may have the form of bumps 150 as shown in FIG. 12.

Other portions are materially the same as Example 1-D1. A high reliability of bond was confirmed also in this Example. This Example showed superior characteristics also in various other respects.

EXAMPLE 9

Figure 16A:
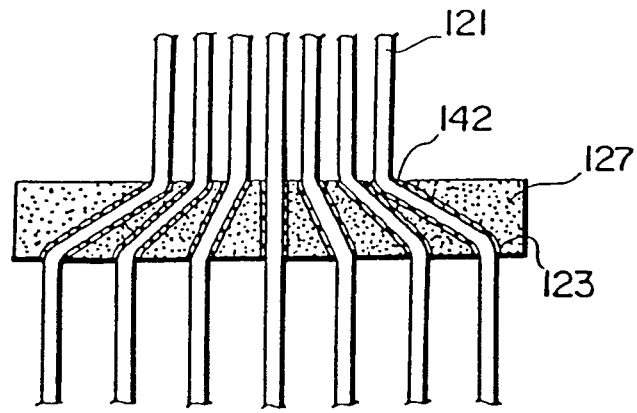
Figure 16B:
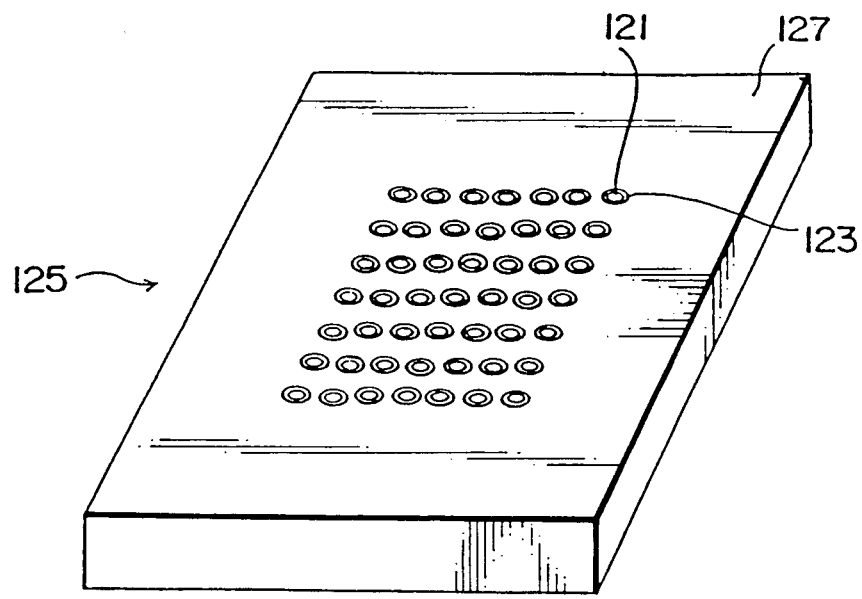
FIG. 16(b) is a perspective view.
Figure 16C:

FIGS. 16(a), 16(b) and 16(c) show an electrical connecting member used in Example 9. More specifically, FIG. 16(a) shows the electrical connecting member in the course of production, FIG. 16(b) is a perspective view of the electrical connecting member shown in FIG. 16(a) and FIG. 16(c) is another sectional view of the electrical connecting member.

The electrical connecting member is prepared by the following process. A holding body 127 made of an alumina ceramics material, provided with holes 142 of a size greater than 20 μm is prepared. Then, metallic or alloy wires 121 such as of alluminum, 20 μm in diameter, are inserted into the holes 142. Then, a resin 123 is charged into the gap between the wires 121 and the walls of the holes 142 and then set so as to become an intermediary stuffing member. Then, the wires 121 were cut at the level of the broken line 124, whereby an electrical connecting member 125 was formed. The thus produced electrical connecting member is shown in FIGS. 16(b) and 16(c).

The electrical connecting member 125 may be further processed to exhibit protections of the metallic members as shown in FIG. 11 or to have bumps as shown in FIG. 12.

A high reliability of bond was confirmed also in this Example. Other characteristics also were superior.

EXAMPLE 10-D1

Example 10-D1 will be described with reference to FIGS. 5(a), 5(b), 5(c)-1 and FIG. 6.

An electrical circuit device produced by this embodiment has the following components:

an electrical connecting member 125 which has a holding body 111 made of an organic material and a plurality of metallic members 107 as electrically conductive members embedded in the holding body 111, the metallic members 107 being exposed at their one ends in one side of the holding body 111 and at their other ends in the other side of the holding body 111;

a semiconductor device 101 having connecting regions 102 at which it is bonded, through metallizing or alloying effected by high-frequency induction heating, to one ends of the metallic members exposed in one side of the holding body 111;

a circuit board 104 having connecting regions 105 at which it is bonded, through metallizing or alloying effected by high-frequency induction heating, to the other ends of the metallic members exposed in the other side of the holding body 111; and a sealing material 170 with which both the semiconductor device 101 and the circuit board 104 are sealed.

Example 10-D1 will be described in more detail.

The nature of the electrical connecting member 125, as well as an example of a process for preparing this electrical connecting member, will be explained with reference to FIGS. 6(a) to 6(c).

Referring first to FIG. 6(a), a metallic wire 121 made of, for example, Al or a suitable alloy and having a diameter of 20 μm, is wound on a rod 122 at a pitch of 40 μm. After the winding, the above-mentioned metallic wire 121 is embedded in, for example, a resin 123 such as a polyimide resin. The resin 123 is then cured and set so that the set resin 123 serves as an insulator. The resin is then sliced as indicated by broken lines 124 so that a plurality of electrical connecting members 125 are formed. FIGS. 6(b) and 6(c) show one of the electrical connecting member.

In the thus formed electrical connecting member 125, the fractions of the metallic wire 121 constitute the metallic members 107, while the insulating resin 123 serves as the holding body 111.

It will be seen that the fractions of the metal wire 121, i.e., the metallic members 107, are insulated from one another by the resin 123. The metallic members 107 as the fractions of the metallic wire 121 are exposed at their one ends in the surface of the holding body 111 adjacent to the semiconductor device 101 and at their other ends in the surface of the holding body 11 adjacent to the circuit board 104. These exposed portions of the metallic members serve as connecting portions 108, 109 where the electrical connecting member 125 is to be bonded both to the semiconductor device 101 and the circuit board 104.

Then, the semiconductor device 101, the electrical connecting member 125 and the circuit board 104 are arranged in a manner shown in FIG. 5(a). The semiconductor device 101 and the circuit board 104 have a multiplicity of connecting portions 102 and 105 located at portions other than the outer peripheries thereof.

It will also be seen that the positions of the connecting portions 102 of the semiconductor device 101 are determined to correspond to the connecting portions 105 of the circuit board 104, as well as to the connecting portions 108, 109 of the electrical connecting member 125.

The semiconductor device 101, the electrical connecting member 125 and the circuit board 104 are set such that positional alignment is attained between the connecting portions 102 of the semiconductor device 101 and the connecting portions 108 of the electrical connecting member 125 and/or between the connecting portions 105 of the circuit board 104 and the connecting portions 109 of the electrical connecting member 125. After the setting, high-frequency induction heating is conducted both on the region where the Al material of the connecting portions 102 of the semiconductor device 101 and the Al material of the connecting portions 108 of the electrical connecting member 125 contact each other and the region where the Al material of the connecting portions 109 of the electrical connecting member 125 contacts the Au material of the connecting portions 105 of the circuit board 104, so that metallizing or alloying is caused in each of these regions, whereby the semiconductor device 101 and the circuit board 104 are bonded to each other through the electrical connecting member, as shown in FIG. 5(b). Factors such as the power level, frequency and direction of the high-frequency induction heating are determined through experiments.

The connecting of the semiconductor device 101 and the circuit board 104 through the electrical connecting member 125 by metallizing or alloying may be conducted in accordance with one of the three methods explained before in connection with Example 1-D1, except that high-frequency induction heating is used in place of the supersonic heating.

Then, the electrical circuit thus formed is sealed so that a sealed electrical circuit device is obtained as shown in FIG. 5(c)-1. More specifically, in this Example, both the semiconductor device 101 and the circuit board 104 are sealed. The sealing is conducted by injection molding, using a thermoplastic resin as the sealing material.

The thus obtained electrical circuit device is subjected to a test for examining the quality of the bonds and showed high reliability at each bond. The electrical circuit device also showed superior characteristics in other respects.

EXAMPLE 10-D2

This Example is obtained substantially in the same manner as Example 1-D2 except that high-frequency induction heating was used in place of the supersonic heating as the connecting method for connecting electrical circuit components. A high level of reliability was confirmed in this Example. This Example showed superior characteristics also in various other respects.

EXAMPLE 10-D3

This Example is obtained substantially in the same manner as Example 1-D3 except that high-frequency induction heating is used in place of the supersonic heating as the connecting method for connecting electrical circuit components. A high level of reliability was confirmed in this Example. This Example showed superior characteristics also in various other respects.

EXAMPLE 10-D4

This Example was obtained substantially in the same manner as Example 1-D4 except that high-frequency induction heating is used in place of the supersonic heating as the connecting method for connecting electrical circuit components. A high level of reliability was confirmed in this Example. This Example showed superior characteristics also in various other respects.

EXAMPLE 10-E1

This Example was obtained substantially in the same manner as Example 1-E1 except that high-frequency induction heating is used in place of the supersonic heating as the connecting method for connecting electrical circuit components. A high level of reliability was confirmed in this Example. This Example showed superior characteristics also in various other respects.

EXAMPLE 10-E2

This Example was obtained substantially in the same manner as Example 1-E2 except that high-frequency induction heating was used in place of the supersonic heating as the connecting method for connecting electrical circuit components. A high level of reliability was confirmed in this Example. This Example showed superior characteristics also in various other respects.

EXAMPLE 11-D1

Example 11-D1 will be described with reference to FIGS. 7(a) and 7(b)-1.

In this Example, a circuit board 51 having connecting portions 52 is used as a first electrical circuit component, while a semiconductor device 4 having a multiplicity of internal connecting portions 5 is used as the second electrical circuit component.

The electrical connecting member 125 used in this Example has a holding body made of an organic material in which dispersed were powder particles (not shown) of SiO$_2$.

In this Example, the connecting portions 54 of the electrical connecting member and the connecting portions 52 of the circuit board 51 are bonded by metallizing and/or alloying effected by high-frequency induction heating, while the connecting between the electrical circuit component 125 and the semiconductor device 4 is executed by a method other than metallizing and/or alloying. Namely, the semiconductor device 4 is pressed onto the electrical connecting member 125 and temporarily held thereon and then the semiconductor device 4 is sealed.

The electrical connecting member 125 used in this Example had a size corresponding to that of the semiconductor device 4.

In this Example, a lead frame 55 is connected to the underside of the circuit board 51.

It is also to be noted that only the semiconductor device 4 is sealed in this Example. A material composed of a thermoplastic resin with powdered SiO$_2$ dispersed therein is used as the sealing material.

Other portions are materially the same as those of Example 10-D1.

It was confirmed also that the connecting is attained with a high degree of reliability. The electrical circuit device thus formed showed superior characteristics also in other respects.

EXAMPLE 11-D2

This Example is obtained substantially in the same manner as Example 2-D2 except that high-frequency induction heating is used in place of the supersonic heating as the connecting method for connecting electrical circuit components. A high level of reliability was confirmed in this Example. This Example showed superior characteristics also in various outer respects.

EXAMPLE 11-D3

This Example is obtained substantially in the same manner as Example 2-D3 except that high-frequency induction heating is used in place of the supersonic heating as the connecting method for connecting electrical circuit components. A high level of reliability was confirmed in this Example. This Example showed superior characteristics also in various other respects.

EXAMPLE 11-D4

This Example is obtained substantially in the same manner as Example 2-D4 except that high-frequency induction heating is used in place of the supersonic heating as the connecting method for connecting electrical circuit components. A high level of reliability was confirmed in this Example. This Example showed superior characteristics also in various other respects.

EXAMPLE 11-E1

This Example is obtained substantially in the same manner as Example 2-E1 except that high-frequency induction heating is used in place of the supersonic heating as the connecting method for connecting electrical circuit components. A high level of reliability was confirmed in this Example. This Example showed superior characteristics also in various other respects.

EXAMPLE 11-E2

This Example is obtained substantially in the same manner as Example 2-E2 except that high-frequency induction heating is used in place of the supersonic heating as the connecting method for connecting electrical circuit components. A high level of reliability was confirmed in this Example. This Example showed superior characteristics also in various other respects.

EXAMPLE 12-D1

This Example is obtained substantially in the same manner as Example 3-D1 except that high-frequency induction heating was used in place of the supersonic heating as the connecting method for connecting electrical circuit components. A high level of reliability was confirmed in this Example. This Example showed superior characteristics also in various other respects.

EXAMPLE 12-D2

This Example is obtained substantially in the same manner as Example 3-D2 except that high-frequency induction heating is used in place of the supersonic heating as the connecting method for connecting electrical circuit components. A high level of reliability was confirmed in this Example. This Example showed superior characteristics also in various other respects.

EXAMPLE 12-D3

This Example is obtained substantially in the same manner as Example 3-D3 except that high-frequency induction heating is used in place of the supersonic heating as the connecting method for connecting electrical circuit components. A high level of reliability was confirmed in this Example. This Example showed superior characteristics also in various other respects.

EXAMPLE 12-D4

This Example is obtained substantially in the same manner as Example 3-D4 except that high-frequency induction heating is used in place of the supersonic heating as the connecting method for connecting electrical circuit components. A high level of reliability was confirmed in this Example. This Example showed superior characteristics also in various other respects.

EXAMPLE 12-E1

This Example is obtained substantially in the same manner as Example 3-E1 except that high-frequency induction heating is used in place of the supersonic heating as the connecting method for connecting electrical circuit components. A high level of reliability was confirmed in this Example. This Example showed superior characteristics also in various other respects.

EXAMPLE 12-E2

This Example is obtained substantially in the same manner as Example 3-E2 except that high-frequency induction heating is used in place of the supersonic heating as the connecting method for connecting electrical circuit components. A high level of reliability was confirmed in this Example. This Example showed superior characteristics also in various other respects.

EXAMPLE 13-D1

This Example is obtained substantially in the same manner as Example 4-D1 except that high-frequency induction heating is used in place of the supersonic heating as the connecting method for connecting electrical circuit components. A high level of reliability was confirmed in this Example. This Example showed superior characteristics also in various other respects.

EXAMPLE 13-D2

This Example is obtained substantially in the same manner as Example 4-D2 except that high-frequency induction heating is used in place of the supersonic heating as the connecting method for connecting electrical circuit components. A high level of reliability was confirmed in this Example. This Example showed superior characteristics also in various other respects.

EXAMPLE 13-D3

This Example is obtained substantially in the same manner as Example 4-D3 except that high-frequency induction heating is used in place of the supersonic heating as the connecting method for connecting electrical circuit components. A high level of reliability was confirmed in this Example. This Example showed superior characteristics also in various other respects.

EXAMPLE 13-D4

This Example is obtained substantially in the same manner as Example 4-D4 except that high-frequency induction heating is used in place of the supersonic heating as the connecting method for connecting electrical circuit components. A high level of reliability was confirmed in this Example. This Example showed superior characteristics also in various other respects.

EXAMPLE 13-E1

This Example is obtained substantially in the same manner as Example 4-E1 except that high-frequency induction heating is used in place of the supersonic heating as the connecting method for connecting electrical circuit components. A high level of reliability was confirmed in this Example. This Example showed superior characteristics also in various other respects.

EXAMPLE 13-E2

This Example is obtained substantially in the same manner as Example 4-E2 except that high-frequency induction heating is used in place of the supersonic heating as the connecting method for connecting electrical circuit components. A high level of reliability was confirmed in this Example. This Example showed superior characteristics also in various other respects.

EXAMPLE 14

Example 14 will be described with reference to FIG. 10. In this Example, circuit boards 101 and 104 which are sealed at portions thereof other than the connecting portions are used as first and second electrical circuit components. FIG. 11 shows an electrical connecting member 125 used in Example 5. As will be seen from this Figure, the exposed portions of the metallic members projected from the surface of the holding body (resin insulating member) 111. This electrical connecting member 125 can be prepared, for example, by the following method.

An electrical connecting member is prepared preform of an electrical connecting member of the type shown in FIGS. 6(b) and 6(c) is prepared by the method described in connection with Example 10-D1. Then, both surfaces of the preform are etched until the electrical wire 121 projects from the polyimide resin by an amount of 10 μm or so. This amount of projection, however, is not exclusive and the amount may be determined freely. It is also possible to use various chemical and/or mechanical processes, though etching has been specifically mentioned.

Other portions are materially the same as those of Example 1-D1.

It is possible to form bumps 150 as shown in FIG. 8. Such bumps can be formed by preparing dies having recesses at positions corresponding to the metal wires 121 of the electrical connecting member 125, and pressing the electrical connecting member 125 between these dies so as to collapse the projections 126. Such bumps 150 suppresses any risk for the metallic wires 121 to come off the insulating member 111.

It is to be understood that the metallic wires 121 provide the metallic members 107 while the resin 123 provides the insulating member 111 also in this embodiment.

The formation of the bumps can be conducted in various other methods such as melting of the exposed metallic members by applying heat thereto.

A high reliability of bonds was confirmed also in this Example. This Example showed superior characteristics even in other respects.

EXAMPLE 15-D1

This Example is obtained substantially in the same manner as Example 6-D1 except that high-frequency induction heating is used in place of the supersonic heating as the connecting method for connecting electrical circuit components. A high level of reliability was confirmed in this Example. This Example showed superior characteristics also in various other respects.

EXAMPLE 15-D2

This Example is obtained substantially in the same manner as Example 6-D2 except that high-frequency induction heating is used in place of the supersonic heating as the connecting method for connecting electrical circuit components. A high level of reliability was confirmed in this Example. This Example showed superior characteristics also in various other respects.

EXAMPLE 15-D3

This Example is obtained substantially in the same manner as Example 6-D3 except that high-frequency induction heating is used in place of the supersonic heating as the connecting method for connecting electrical circuit components. A high level of reliability was confirmed in this Example. This Example showed superior characteristics also in various other respects.

EXAMPLE 15-D4

This Example is obtained substantially in the same manner as Example 6-D4 except that high-frequency induction heating is used in place of the supersonic heating as the connecting method for connecting electrical circuit components. A high level of reliability was confirmed in this Example. This Example showed superior characteristics also in various other respects.

EXAMPLE 15-E1

This Example is obtained substantially in the same manner as Example 6-E1 except that high-frequency induction heating is used in place of the supersonic heating as the connecting method for connecting electrical circuit components. A high level of reliability was confirmed in this Example. This Example showed superior characteristics also in various other respects.

EXAMPLE 15-E2

This Example is obtained substantially in the same manner as Example 6-E2 except that high-frequency induction heating is used in place of the supersonic heating as the connecting method for connecting electrical circuit components. A high level of reliability was confirmed in this Example. This Example showed superior characteristics also in various other respects.

EXAMPLE 16

This Example is obtained substantially in the same manner as Example 7 except that high-frequency induction heating is used in place of the supersonic heating as the connecting method for connecting electrical circuit components. A high level of reliability was confirmed in this Example. This Example showed superior characteristics also in various other respects.

EXAMPLE 17

This Example is obtained substantially in the same manner as Example 8 except that high-frequency induction heating is used in place of the supersonic heating as the connecting method for connecting electrical circuit components. A high level of reliability was confirmed in this Example. This Example showed superior characteristics also in various other respects.

EXAMPLE 18

This Example is obtained substantially in the same manner as Example 9 except that high-frequency induction heating is used in place of the supersonic heating as the connecting method for connecting electrical circuit components. A high level of reliability was confirmed in this Example. This Example showed superior characteristics also in various other respects.

EXAMPLE 19-D1

Example 19-D1 will be described with reference to FIGS. 5(*a*), 5(*b*), 5(*c*)-1 and FIG. 6.

An electrical circuit device produced by this embodiment has the following components:

an electrical connecting member 125 which has a holding body 111 made of an organic material with a powder dispersed therein and a plurality of metallic members 107 as electrically conductive members embedded in the holding body 111, the metallic members 107 being exposed at their one ends in one side of the holding body 111 and at their other ends in the other side of the holding body 111;

a semiconductor device 101 having connecting regions 102 at which it is bonded, through metallizing or alloying effected by high-frequency dielectric heating or microwave heating, to one end of the metallic members exposed in one side of the holding body 111;

a circuit board 104 having connecting regions 105 at which it is bonded, through metallizing or alloying effected by high-frequency dielectric heating or microwave heating, to the other ends of the metallic members exposed in the other side of the holding body 111; and a sealing material 170 with which both the semiconductor device 101 and the circuit board 104 are sealed.

Example 19-D1 will be described in more detail.

The nature of the electrical connecting member 125, as well as an example of a process for preparing this electrical connecting member, will be explained with reference to FIGS. 6(*a*) to 6(*c*).

Referring first to FIG. 6(*a*), a metallic wire 121 made of, for example, Al or a suitable alloy and having a diameter of 20 μm, is wound on a rod 122 at a pitch of 40 μm. After the winding, the above-mentioned metallic wire 121 is embedded in, for example, a resin 123 such as a polyimide resin. Before embedding the metallic wire 121, powder of barium titanate is mixed and dispersed in the resin 123. The resin 123 is then cured and set so that the set resin 123 serves as an insulator. The resin was then sliced as indicated by broken lines 124 so that a plurality of electrical connecting members 125 are formed. FIGS. 6(*b*) and 6(*c*) show one of the electrical connecting members. The powder dispersed is not shown in these Figures. In this embodiment, the dispersion of the powder is effected by agitation but other suitable dispersing method can be used equally well. It is also to be understood that any suitable ferroelectric material in the form of powder, fibers and so forth may be embedded, although barium titanate is specifically mentioned.

In the thus formed electrical connecting member 125, the fractions of the metallic wire 121 constitute the metallic members 107, while the insulating resin 123 serves as the holding body 111.

It will be seen that the fractions of the metal wire 121, i.e., the metallic members 107, are insulated from one another by the resin 123. The metallic members 107 as the fractions of the metallic wire 121 are exposed at their one ends in the surface of the holding body 111 adjacent to the semiconductor device 101 and at their other ends in the surface of the holding body 11 adjacent to the circuit board 104. These exposed portions of the metallic members serve as connecting portions 108, 109 where the electrical connecting member 125 is to be bonded both to the semiconductor device 101 and the circuit board 104.

Then, the semiconductor device 101, the electrical connecting member 125 and the circuit board 104 are arranged in a manner shown in FIG. 5(a). The semiconductor device 101 and the circuit board 104 have a multiplicity of connecting portions 102 and 105 located at portions other than the outer peripheries thereof.

It will also be seen that the positions of the connecting portions 102 of the semiconductor device 101 are determined to correspond to the connecting portions 105 of the circuit board 104, as well as to the connecting portions 108, 109 of the electrical connecting member 125.

The semiconductor device 101, the electrical connecting member 125 and the circuit board 104 are set such that positional alignment is attained between the connecting portions 102 of the semiconductor device 101 and the connecting portions 108 of the electrical connecting member 125 and/or between the connecting portions 105 of the circuit board 104 and the connecting portions 109 of the electrical connecting member 125. After the setting, high-frequency dielectric heating or microwave heating was conducted both on the region where the Al material of the connecting portions 102 of the semiconductor device 101 and the Al material of the connecting portions 108 of the electrical connecting member 125 contact each other and the region where the Al material of the connecting portions 109 of the electrical connecting member 125 contacts the Au material of the connecting portions 105 of the circuit board 104, so that metallizing or alloying is caused in each of these regions, whereby the semiconductor device 101 and the circuit board 104 are bonded to each other through the electrical connecting member, as shown in FIG. 5(b). Operating conditions of the high-frequency dielectric heating apparatus or the microwave heating apparatus are determined through experiments.

The connecting of the semiconductor device 101 and the circuit board 104 through the electrical connecting member 125 by metallizing or alloying may be conducted in accordance with one of the three methods explained before in connection with Example 1-D1, except that high-frequency dielectric heating or microwave heating is used in place of the supersonic heating.

Then, the electrical circuit thus formed is sealed so that a sealed electrical circuit device was obtained as shown in FIG. 5(c)-1. More specifically, in this Example, both the semiconductor device 101 and the circuit board 104 are sealed. The sealing is conducted by injection molding, using a thermoplastic resin as the sealing material.

The thus obtained electrical circuit device was subjected to a test for examining the quality of the bonds and showed high reliability at each bond. The electrical circuit device also showed superior characteristics in other respects.

EXAMPLE 19-D2

This Example is obtained substantially in the same manner as Example 1-D2 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 19-D3

This Example is obtained substantially in the same manner as Example 1-D3 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 19-D4

This Example is obtained substantially in the same manner as Example 1-D4 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 19-E1

This Example is obtained substantially in the same manner as Example 1-E1 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 19-E2

This Example is obtained substantially in the same manner as Example 1-E2 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 20-D1

Example 20-D1 will be described with reference to FIGS. 7(a) and 7(b)-1.

In this Example, a circuit board 51 having connecting portions 52 is used as a first electrical circuit component, while a semiconductor device 4 having a multiplicity of internal connecting portions 5 is used as the second electrical circuit component.

The electrical connecting member 125 used in this Example has a holding body made of an organic material in which dispersed were powder particles (not shown) of barium titanate and $SiO_2$.

In this Example, the connecting portions 54 of the electrical connecting member and the connecting portions 52 of the circuit board 51 are bonded by metallizing and/or alloying effected by high-frequency dielectric heating, while the connecting between the electrical circuit component 125 and the semiconductor device 4 is executed by a method other than metallizing and/or alloying. Namely, the semiconductor device 4 is pressed onto the electrical connecting member 125 and temporarily held thereon and then the semiconductor device 4 is sealed.

The electrical connecting member 125 used in this Example had a size corresponding to that of the semiconductor device 4.

EXAMPLE 20-D2

This Example is obtained substantially in the same manner as Example 2-D2 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 20-D3

This Example is obtained substantially in the same manner as Example 2-D3 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 20-D4

This Example is obtained substantially in the same manner as Example 2-D4 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 20-E1

This Example is obtained substantially in the same manner as Example 2-E1 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 20-E2

This Example is obtained substantially in the same manner as Example 2-E2 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 21-D1

This Example is obtained substantially in the same manner as Example 3-D1 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 21-D2

This Example is obtained substantially in the same manner as Example 3-D2 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 21-D3

This Example is obtained substantially in the same manner as Example 3-D3 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 21-D4

This Example is obtained substantially in the same manner as Example 3-D4 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 21-E1

This Example is obtained substantially in the same manner as Example 3-E1 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 21-E2

This Example is obtained substantially in the same manner as Example 3-E2 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 22-D1

FIG. 9(a)-1 shows Example 22-D1. In this Example, semiconductor devices 4' and 4 are used as first and second electrical circuit components. The electrical connecting member 125 used in this Example has a size corresponding to the semiconductor device 4. In addition, a lead frame 1 is connected to metallic members which are exposed on the side of the electrical connecting member 125 adjacent to the first semiconductor device 4'. An organic material with dispersion of either one of powders and fibers of a ferroelectric material such as barium titanate is used as the insulation member of the electrical connecting member 125. In FIG. 9(*a*)-1, both the semiconductor devices 4 and 4' are bonded to the electrical connecting member by metallizing and/or alloying effected by high-frequency dielectric heating or microwave heating. In FIG. 9(*b*)-1, only one of the semiconductor devices is bonded through metallizing and/or alloying.

In the electrical circuit device shown in FIG. 9(*a*)-1, both the semiconductor devices 4, 4' on the upper side are wholly sealed with a sealing material, whereas, in FIG. 9(*b*)-1, the semiconductor devices 4, 4' are sealed only at their side surfaces, with their upper surfaces exposed to the outside.

Other portions are materially the same as those of Example 21-D1.

High reliability of connecting was confirmed also in this Example. This Example exhibited superior characteristics in various other respects.

EXAMPLE 22-D2

This Example is obtained substantially in the same manner as Example 4-D2 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 22-D3

This Example is obtained substantially in the same manner as Example 4-D3 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 22-D4

This Example is obtained substantially in the same manner as Example 4-D4 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 22-E1

This Example is obtained substantially in the same manner as Example 4-E1 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 22-E2

This Example is obtained substantially in the same manner as Example 4-E2 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 23

This Example is obtained substantially in the same manner as Example 5 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 24

This Example is obtained substantially in the same manner as Example 6 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 25

This Example is obtained substantially in the same manner as Example 7 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 26

This Example is obtained substantially in the same manner as Example 8 except that high-frequency dielectric heating or microwave heating is used in place of the supersonic heating as the connecting method for connecting electrical circuit components. A high level of reliability was confirmed in this Example. This Example showed superior characteristics also in various other respects.

EXAMPLE 27

This Example is obtained substantially in the same manner as Example 9 except that high-frequency dielectric heating or microwave heating is used in place of the supersonic heating as the connecting method for connecting electrical circuit components. A high level of reliability was confirmed in this Example. This Example showed superior characteristics also in various other respects.

As will be understood from the foregoing description, the present invention offers the following advantages.

(1) Electrical connecting between electrical circuit components such as semiconductor devices, circuit board, lead frame and so forth can be made with a high degree of reliability. The method of the invention therefore is usable in place of conventional methods such as wire connecting method, B method, CCB method and so forth.

(2) According to the invention, locations of connecting portions of an electrical circuit component can be determined freely, i.e., not only on the peripheral portion thereof but also at inner or central regions. It is therefore possible to increase the number of connecting points as compared with conventional wire connecting and TAB methods. In addition, the metallic conductors in the electrical connecting member are electrically insulated from one another by the insulating material between these conductors, so that the risk of short-circuiting is reduced thereby allowing a greater number of connecting points to be employed as compared with CCB method.

(3) The quantity of the metal used as the conductive members in the electrical connecting member is much smaller as compared with the known methods. Therefore, precious or expensive metals such as gold can be used while attaining a reduction in the production cost.

(4) An electrical circuit device can be produced which has elements such as semiconductor devices arranged at a high density.

(5) In an embodiment which employs supersonic heating, the electrically conductive members exposed in one or both sides of the holding body of the electrical connecting member are bonded to the adjacent electrical circuit component or parts by selective internal heating effected by supersonic heating. Therefore, any detrimental thermal effect such as degradation or changing of nature of a material or materials which are liable to be thermally affected can be suppressed even when such a material or materials exist in at least a portion of the electrical circuit component or in the vicinity thereof, whereby the connecting can be accomplished in a satisfactory manner. For the same reason, it is possible to reduce any adverse effect of thermal expansion or contraction on at least a portion of the electrical circuit component or a material in the vicinity of the electrical circuit component.

(6) In an embodiment which employs high-frequency induction heating, the electrically conductive members exposed in one or both sides of the holding body of the electrical connecting member are bonded to the adjacent electrical circuit component or parts by selective internal heating effected by supersonic heating. Therefore, any detrimental thermal effect such as degradation or changing of nature of a material or materials which are liable to be thermally affected can be suppressed even when such a material or materials exist in at least a portion of the electrical circuit component or in the vicinity thereof, thus enabling the connecting to be accomplished in a satisfactory manner and widening the applicability of connecting. For the same reason, it is possible to reduce any adverse effect of thermal expansion or contraction on at least a portion of the electrical circuit component or a material in the vicinity of the electrical circuit component. In addition, since the high-frequency electromagnetic field can be applied uniformly, it is possible to effect uniform heating. Furthermore, necessity for jigs for pressing the heated objects can be eliminated because the heating can be done in a non-contact manner.

(7) In an embodiment which employs high-frequency dielectric heating or microwave heating, the electrically conductive members exposed in one or both sides of the holding body of the electrical connecting member are bonded to the adjacent electrical circuit component or parts by selective internal heating effected by supersonic heating. Therefore, any detrimental thermal effect such as degradation or changing of nature of a material or materials which are liable to be thermally affected can be suppressed even when such a material or materials exist in at least a portion of the electrical circuit component or in the vicinity thereof, thus enabling the connecting to be accomplished in a satisfactory manner and widening the applicability of connecting. For the same reason, it is possible to reduce any adverse effect of thermal expansion or contraction on at least a portion of the electrical circuit component or a material in the vicinity of the electrical circuit component. In addition, since the high-frequency electromagnetic field can be applied uniformly, it is possible to effect uniform heating. Furthermore, necessity for jigs for pressing the heated objects can be eliminated because the heating can be done in a non-contact manner.

(8) The connection of an electrical circuit component to the electrical connecting member at one side of the electrical connecting member may be conducted by a method other than by connecting through metallizing or alloying. In such a case, it is possible to avoid any detrimental effect of metallizing or alloying heat on such an electrical circuit component. In some cases, it is desired that an electrical circuit component is connected in a detachable manner. The use of a connecting method other than metallizing or alloying well copes with such a demand.

When two electrical circuit components are connected through the electrical connecting member at connecting regions formed as a result of metallizing or alloying, both electrical circuit components are strongly and securely bonded, thus attaining a high mechanical strength, as well as reduced rate of production of unacceptable products.

(9) Possibility of injection of a sealing material enables the use of a constant-pressure transfer thermosetting resin, as well as thermoplastic resins which require high injection pressure.

(10) The sealing material can contain either one or both of powders and fibers of a metal, alloy or a ceramics, dispersed therein. In such a case, the thermal expansion coefficient of the sealing material can approximate that of the sealing material, so that the level of thermal stress can be lowered, thus attaining a high reliability of the electrical circuit device.

(11) When a sealing cap is used, it is possible to form free spaces or gaps between the cap and the electrical circuit component sealed with the cap. Such free spaces or gaps serve to reduce thermal stress, thus offering a higher reliability of the electrical circuit device. The cap also may be made of a material having a high electrical conductivity and held in contact with the electrical circuit component sealed with the cap. In such a case, the heat generated by the electrical circuit component can efficiently be dissipated to ensure good heat radiation characteristic of the electrical circuit device. Furthermore, an electrical circuit device having a superior shielding effect can be obtained by the use of a cap made of a material having a good shielding effect, particularly a ferrous metal.

(12) It is possible to place an adjusting member between the cap and the electrical circuit component. The use of such an adjusting member allows an efficient assembly despite any fluctuation in the height of the electrical circuit components.

(13) A plate may be fixed to at least a portion of the surface of the sealing material. It is also possible to adhere plates to electrical circuit components which are bonded through the electrical connecting member and at least a part of at least one of such plates may be embedded in the sealing material. It is also possible to arrange such that a plate or plates disposed in the vicinity of an electrical circuit component or parts are embedded in the sealing material at least partially. Such a plate or plates serve to relax any concentration of stress which may be caused internally or by application of an external force, thus preventing damages such as cracking. The plate also serves to increase the physical surface distance from the exterior to the electrical circuit component, thus suppressing any tendency for water and other foreign matters to reach the internal circuit component.

The plate may be made of a metal such as a stainless steel or a material having a high heat conductivity such as a ceramics, carbon, diamond or the like. In such a case, the plate can serve as a heat radiator for allowing the heat of the electrical circuit component to be quickly dissipated, thus offering superior heat radiation characteristic of the electrical circuit device. The plate, when made of a metal, also serves as a shielding member which shields interior of the electrical circuit device from external noises, thus protecting the electrical circuit device from external noise.

(14) A high shielding effect is obtained also when the insulating holding body of the electrical connecting member contains powders and/or fibers of a metal.

(15) The holding body of the electrical connecting member may be made of an insulating material with dispersion of powders and/or fibers of a metal and/or an inorganic material having high heat conductivity. Alternatively, the metallic members of the electrical connecting member may be insulated by a suitable insulating material. It is also possible to use an inorganic material having high heat conductivity as the material of the carrier of the electrical circuit connecting member. In such cases, heat generated in the electrical circuit component can efficiently be dissipated to the exterior through the electrical connecting member and also through the other electrical circuit component, thus offering good heat radiation characteristics of the electrical circuit device.

It is possible to disperse, in the material of the insulator in the electrical connecting member, powders and/or fibers of one or more of a metal and an inorganic material which have thermal expansion coefficients approximating that of the electrical circuit component. In such arrangement, the electrical connecting member can exhibit a thermal expansion coefficient which well approximates that of the electrical circuit component, thus reducing the level of thermal stress when the circuit device is used in severe thermal condition. It is therefore possible to obtain an electric circuit device and, hence, a semiconductor circuit having a high degree of reliability.

What is claimed is:

1. A method of producing an electrical circuit device, comprising the steps of:
    preparing an electrical connecting member including a holding body made of an electrically insulating material and a plurality of electrically conductive members embedded in the holding body, each electrically conductive member having a first end exposed through one side of the holding body and a second end exposed through the other side of the holding body;
    preparing a first electrical circuit component having connecting portions to which the first ends of the electrically conductive members of the electrical connecting member are to be bonded;
    providing a stainless steel plate proximate to the first electrical circuit component;
    preparing a second electrical circuit component having connecting portions to which the second ends of the electrically conductive members of the electrical connecting member are to be bonded;
    sealing the electrical connecting member and the electric circuit components in a cap of resin molding material; and
    effecting an internal heating at at least one of a first connecting region located between the connecting portions of the first electrical circuit component and the first ends of the electrically conductive members of the electrical connecting member and a second connecting region located between the connecting portions of the second electrical circuit component and the second ends of the electrically conductive members of the electrical connecting member, thereby causing alloying in at least one of the first and second connecting regions so as to connect at least one of the first and second electrical circuit components to the electrical connecting member.

2. A method of producing an electrical circuit device, comprising the steps of:
    preparing an electrical connecting member including a holding body made of an electrically insulating material and a plurality of electrically conductive members embedded in the holding body, each electrically conductive member having a first end exposed through one side of the holding body and a second end exposed through the other side of the holding body;
    preparing a first electrical circuit component having connecting portions to which the first ends of the electrically conductive members of the electrical connecting member are to be bonded;
    preparing a second electrical circuit component having connecting portions to which the second ends of the electrically conductive members of the electrical connecting member are to be bonded; and
    effecting supersonic heating at at least one of a first connecting region located between the connecting portions of the first electrical circuit component and the first ends of the electrically conductive members of the electrical connecting member and a second connecting region located between the connecting portions of the second electrical circuit component and the second ends of the electrically conductive members of the electrical connecting member, thereby causing alloying in at least one of the first and second connecting regions so as to connect at least one of the first and second electrical circuit components to the electrical connecting member.

3. A method of producing an electrical circuit device, comprising the steps of:
    preparing an electrical connecting member including a holding body made of an electrically insulating material and a plurality of electrically conductive members embedded in the holding body, each electrically conductive member having a first end exposed through one side of the holding body and a second end exposed through the other side of the holding body;
    preparing a first electrical circuit component having connecting portions to which the first ends of the electrically conductive members of the electrical connecting member are to be bonded;

preparing a second electrical circuit component having connecting portions to which the second ends of the electrically conductive members of the electrical connecting member are to be bonded; and effecting high-frequency induction heating at at least one of a first connecting region located between the connecting portions of the first electrical circuit component and the first ends of the electrically conductive members of the electrical connecting member and a second connecting region located between the connecting portions of the second electrical circuit component and the second ends of the electrically conductive members of the electrical connecting member, thereby causing alloying in at least one of the first and second connecting regions so as to connect at least one of the first and second electrical circuit components to the electrical connecting member.

4. A method of producing an electrical circuit device, comprising the steps of:

preparing an electrical connecting member including a holding body made of an electrically insulating material and a plurality of electrically conductive members embedded in the holding body, each electrically conductive member having a first end exposed through one side of the holding body and a second end exposed through the other side of the holding body;

preparing a first electrical circuit component having connecting portions to which the first ends of the electrically conductive members of the electrical connecting member are to be bonded;

preparing a second electrical circuit component having connecting portions to which the second ends of the electrically conductive members of the electrical connecting member are to be bonded; and effecting high-frequency dielectric heating at at least one of a first connecting region located between the connecting portions of the first electrical circuit component and the first ends of the electrically conductive members of the electrical connecting member and a second connecting region located between the connecting portions of the second electrical circuit component and the second ends of the electrically conductive members of the electrical connecting member, thereby causing alloying in at least one of the first and second connecting regions so as to connect at least one of the first and second electrical circuit components to the electrical connecting member.

5. A method according to claim 2, wherein the supersonic heating at at least one of the first or second connecting regions diffuses atoms of the electrical circuit components and the ends of the electrically conductive members.

6. A method according to claim 2, wherein said supersonic heating method is used for internal heating.

7. A method according to claim 2, further comprising the step of sealing the electrical connecting member and the electrical circuit components in a resin molding material.

8. A method according to claim 2, further comprising the step of sealing the electrical connecting member and the electrical circuit components in a cap.

9. A method according to claim 8, further providing an adjuster within the cap.

10. A method according to claim 3, wherein the high-frequency induction heating at at least one of the first or second connecting regions diffuses atoms of the electrical circuit components and the ends of the electrically conductive members.

11. A method according to claim 3, wherein said high-frequency induction step is an internal heating method.

12. A method according to claim 3, wherein said high-frequency induction step is a microwave heating method.

13. A method according to claim 3, further comprising the step of sealing the electrical connecting member and the electrical circuit components in a resin molding material.

14. A method according to claim 3, further comprising the step of sealing the electrical connecting member and the electrical circuit components in a cap.

15. A method according to claim 14, further providing an adjuster within the cap.

16. A method according to claim 4, wherein the high-frequency dielectric heating at at least one of the first or second connecting regions diffuses atoms of the electrical circuit components and the ends of the electrically conductive members.

17. A method according to claim 4, wherein said high-frequency induction step is an internal heating method.

18. A method according to claim 4, wherein said high-frequency induction step is a microwave heating method.

19. A method according to claim 4, further comprising the step of sealing the electrical connecting member and the electrical circuit components in a resin molding material.

20. A method according to claim 4, further comprising the step of sealing the electrical connecting member and the electrical circuit components in a cap.

21. A method according to claim 20, further providing an adjuster within the cap.

* * * * *

UNITED STATES PATENT AND TRADEMARK OFFICE
CERTIFICATE OF CORRECTION

PATENT NO. : 5,058,800

DATED : October 22, 1991

INVENTOR(S) : Tetsuo Yoshizawa, et al.

It is certified that error appears in the above-identified patent and that said Letters Patent is hereby corrected as shown below:

COLUMN 1:

Line 45, "devices 5 and 5'" should read --devices 4 and 4'--.

COLUMN 2:

Line 18, "surfaces 71' and 70'" should read --surfaces 73' and 72'--.

COLUMN 7:

Line 14, "KNbo$_3$" should read --KNbO$_3$--.

UNITED STATES PATENT AND TRADEMARK OFFICE
CERTIFICATE OF CORRECTION

PATENT NO. : 5,058,800

DATED : October 22, 1991

INVENTOR(S) : Tetsuo Yoshizawa, et al

It is certified that error appears in the above-identified patent and that said Letters Patent is hereby corrected as shown below:

COLUMN 23:

Line 36, "Si)$_2$" should read --SiO$_2$--.

COLUMN 24:

Line 43, "caps 4 and 4'." should read --caps 155.--.

Signed and Sealed this

Thirtieth Day of March, 1993

*Attest:*

STEPHEN G. KUNIN

*Attesting Officer*   *Acting Commissioner of Patents and Trademarks*